(12) United States Patent
Knezovic et al.

(10) Patent No.: US 12,166,353 B2
(45) Date of Patent: Dec. 10, 2024

(54) DETERMINATION OF PHASE CONNECTIONS IN A POWER GRID

(71) Applicant: Hitachi Energy Ltd, Zürich (CH)

(72) Inventors: Katarina Knezovic, Zurich (CH); Dmitry Shchetinin, Adlikon bei Regensdorf (CH); Marco Giuntoli, Groß-Gerau (DE); Milos Subasic, Manheim (DE); Peter Noglik, Edingen-Neckarhausen (DE); Giancarlo Dalle Ave, Mannheim (DE)

(73) Assignee: HITACHI ENERGY LTD, Zürich (CH)

( * ) Notice: Subject to any disclaimer, the term of this patent is extended or adjusted under 35 U.S.C. 154(b) by 153 days.

(21) Appl. No.: 17/682,641

(22) Filed: Feb. 28, 2022

(65) Prior Publication Data

US 2022/0278527 A1    Sep. 1, 2022

(30) Foreign Application Priority Data

Feb. 27, 2021    (EP) .................................... 21159796

(51) Int. Cl.
H02J 3/26         (2006.01)
H02J 13/00        (2006.01)

(52) U.S. Cl.
CPC .......... *H02J 3/26* (2013.01); *H02J 13/00002* (2020.01); *H02J 13/00001* (2020.01)

(58) Field of Classification Search
CPC ........ G01R 25/00; G01R 23/02; G01R 22/06; G01R 21/09; G01R 29/16; G01R 22/10;
(Continued)

(56) References Cited

U.S. PATENT DOCUMENTS 8,508,953 B2 *   8/2013  Song ................... G06F 11/2284
                                                        361/784
9,214,836 B2 *  12/2015  Flammer, III ...... H04L 41/0686
(Continued)

FOREIGN PATENT DOCUMENTS

CN      108376982 A      8/2018
CN      108535599 A      9/2018
(Continued)

OTHER PUBLICATIONS

Wang et al., "Phase Identification in Electric Power Distribution Systems by Clustering of Smart Meter Data", 2016 15th IEEE International Conference on Machine Learning and Applications (ICMLA), Anaheim, CA, USA, 8 pages.
(Continued)

*Primary Examiner* — Vinh P Nguyen
(74) *Attorney, Agent, or Firm* — Procopio, Cory, Hargreaves & Savitch, LLP

(57) ABSTRACT

The present disclosure relates to a method for determining phase connections of grid components in a power grid, the method comprising assessing a relative similarity of time series of measured voltage data of the grid components by clustering the time series of measured voltage data of the grid components; grouping the grid components into a plurality of clusters based on the assessing a relative similarity; and assessing a phase connection of the grid components in each cluster of the plurality of clusters. The present disclosure also relates to a respective device and computer program.

16 Claims, 20 Drawing Sheets

(58) Field of Classification Search
CPC .. G01R 22/063; G01R 19/2503; G01R 29/18; G01R 31/088; G01R 19/2513; G01R 31/00; H02J 13/00002; H02J 13/00001; H02J 13/00026; H02J 2203/10; H02J 3/36

See application file for complete search history.

(56) References Cited

U.S. PATENT DOCUMENTS

| | | | | |
|---|---|---|---|---|
| 9,292,794 | B2* | 3/2016 | Arya | G06N 20/00 |
| 9,332,072 | B2* | 5/2016 | Hui | H04L 67/12 |
| 9,568,522 | B2* | 2/2017 | Aiello | G01R 25/005 |
| 9,960,601 | B2* | 5/2018 | Matan | H02J 3/18 |
| 10,312,681 | B2* | 6/2019 | Aiello | H02J 3/12 |
| 10,571,493 | B2* | 2/2020 | Sonderegger | G01R 19/003 |
| 10,598,736 | B2* | 3/2020 | Luan | H02J 3/00 |
| 10,802,056 | B2* | 10/2020 | Léonard | G01R 22/063 |
| 11,740,274 | B2* | 8/2023 | Yu | G06F 16/355 |
| | | | | 324/66 |
| 2015/0052088 | A1 | 2/2015 | Arya et al. | |
| 2016/0352103 | A1 | 12/2016 | Aiello et al. | |

FOREIGN PATENT DOCUMENTS

| | | |
|---|---|---|
| CN | 108734603 A | 11/2018 |
| CN | 109274095 A | 1/2019 |
| CN | 110266524 A | 9/2019 |
| CN | 110492480 A | 11/2019 |
| DE | 102018107423 A1 | 10/2019 |
| JP | H11299098 A | 10/1999 |
| JP | 2015076994 A | 4/2015 |
| JP | 2015076995 A | 4/2015 |
| JP | 2017004312 A | 1/2017 |
| JP | 2019126193 A | 7/2019 |
| JP | 2021535716 A | 12/2021 |
| WO | 2016064889 A1 | 4/2016 |
| WO | 2018/027180 A1 | 2/2018 |
| WO | 2020046536 A1 | 3/2020 |

OTHER PUBLICATIONS

Wang et al., "Advanced Metering Infrastructure Data Driven Phase Identification in Smart Grid", UC Riverside 2017 Publications, Sep. 10, 2017, https://escholarship.org/uc/item/208334hj, 2nd International Conference on Green Communications, Computing and Technologies (GREEN), Rome, Italy, 2017, 32 pages.

Liu et al., "Practical Method for Mitigating Three-Phase Unbalance Based on Data-Driven User Phase Identification", IEEE Transactions on Power Systems, vol. 35, No. 2, Mar. 2020, 4 pages.

Ma, et al., "Phase Identification of Smart Meters by Spectral Clustering", 2018 2nd IEEE Conference on Energy Internet and Energy System Integration (EI2), Beijing, 2018, 978-1-5386-8549-5/18, 5 pages.

Olivier et al., "Phase Identification of Smart Meters by Clustering Voltage Measurements", 2018 Power Systems Computation Conference (PSCC), Dublin 2018, 8 pages.

Blakely et al., "Spectral Clustering for Customer Phase Identification Using AMI Voltage Timeseries", IEEE Power and Energy Conference at Illinois (PECI), 2019, 7 pages.

* cited by examiner

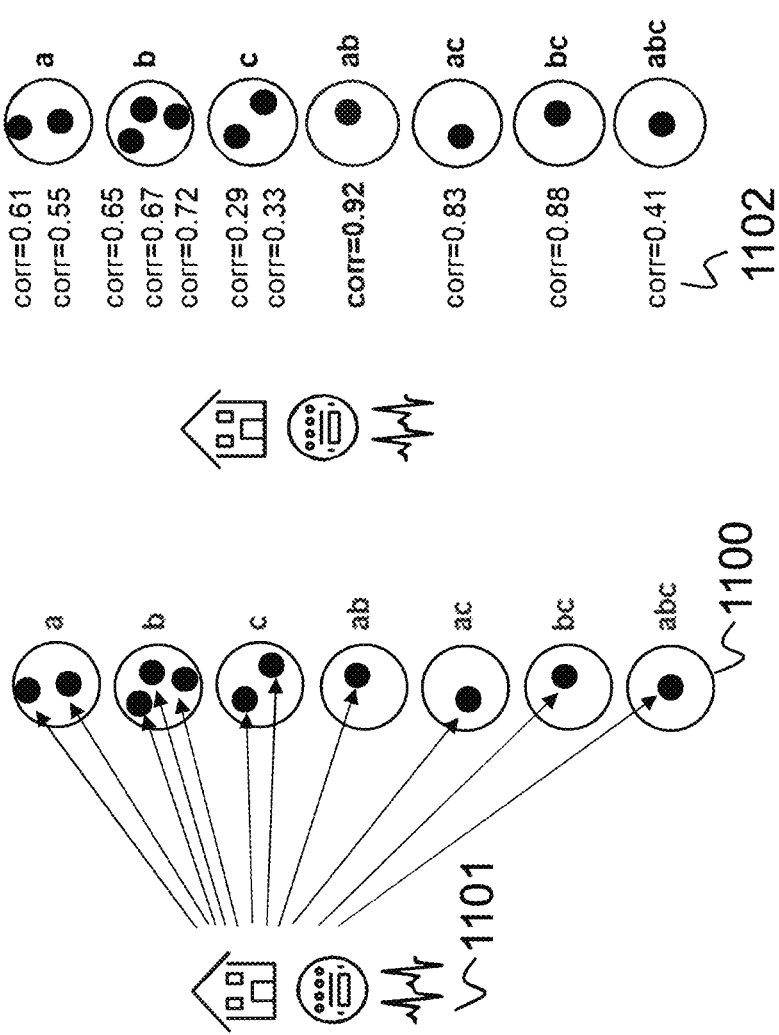
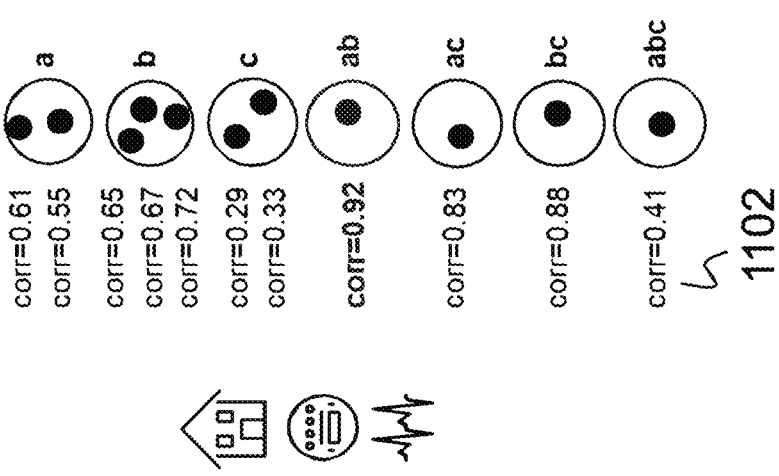
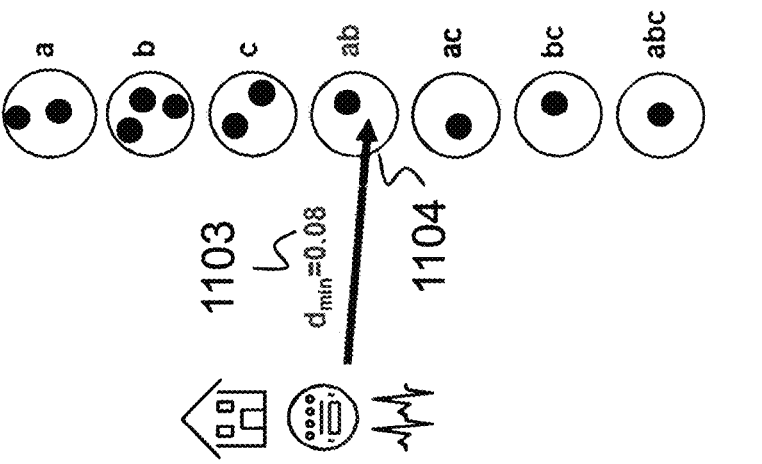

DETERMINATION OF PHASE CONNECTIONS IN A POWER GRID

CROSS-REFERENCE TO RELATED APPLICATIONS

The present application claims priority to European Patent App. No. 21159796.8, filed on Feb. 27, 2021, which is hereby incorporated herein by reference as if set forth in full.

BACKGROUND

Field

The present disclosure relates to a method, a device, and a computer program product for determining phase connections of grid components in a power grid.

Description of the Related Art

Power grids were traditionally designed to handle monodirectional flows of energy and were typically oversized to ensure they would not be stressed under severe loading conditions. While this strategy functioned well for decades due to its simple design and operational rules, nowadays this is no longer the case.

With increased proliferation of variable renewable resources such as wind and solar, as well as the electrification of the transportation and heating sectors, the complexity of a power grid is rapidly increasing with many active components to optimize and coordinate. Hence, power grids are becoming less predictable and there is a need of improved solutions for active grid control.

In this context, many utilities are rolling out metering infrastructure, and various tools have been developed and implemented to monitor a power system behaviour with more detailed geographical and temporal information, e.g. Supervisory Control and Data Acquisition (SCADA), smart meters, and line sensors. However, creating observability out of disjointed data streams remains a challenge, especially considering that the amount of collected data is limited compared to the overall grid size.

With the advent of such advanced monitoring tools, identifying and correcting errors in a power grid, in particular in modelling such a grid, e.g. errors in phase connections, topology or parameter errors is becoming a topic of significant importance, in particular since distribution system operators (DSO), normally do not have complete knowledge of the underlying grid. Thus, the DSOs usually cannot use model-based grid control solutions due to this lacking of detailed knowledge of the underlying grid. Such a lack of detailed measurement data is generally the highest barrier for a model-based grid control solution.

In addition, there is a problem of poor data quality in many database records, e.g. in a Geographic Information System (GIS), since they are often not updated when asset changes are made in the field. Consequently, due to the lack of detailed measurement data and poor data quality from databases, DSOs may not have complete knowledge of the real state of the underlying grid and the corresponding model, so advanced grid control solutions, e.g. unbalanced optimal power flow, voltage regulation, are difficult to apply.

Detailed knowledge of the phase at a point of common coupling of an electrical component is an important aspect of the detailed knowledge of the grid which is needed to develop and improve grid control solutions. In particular, the detailed knowledge of the phase at a point of common coupling of an electrical component from among the phases of a three-phase system is of interest in this context. Knowledge of the phase to which the component and the corresponding electricity meter are connected, assists the distribution system operator to improve the overall efficiency and reliability of the system.

However, it is known that details on the phase connection of an electrical component is one part of the knowledge of the grid which often contains errors, e.g. due to wrong identification of the phase connection at a customer's premise. In the present disclosure, the term "phase connection" does not only refer to a single-phase connection, e.g. a connection with a live wire and with or without a neutral wire, but also to a poly-phase connection, e.g. a connection with two or more live wires and with or without a neutral wire. For example, if the phases are denoted with "a", "b", and "c", the term "phase connection" in the present disclosure refers to both single-phase connections, i.e. "a", "b", "c", and poly-phase connections, i.e. "ab", "ac", "bc" and "abc".

Thus, there is a need to improve the determination of phase connections of grid components in a power grid.

SUMMARY

The above-mentioned objects are achieved with the features of the independent claims. Dependent claims define preferred embodiments of the disclosure.

In particular, the present disclosure relates to a method for determining phase connections of grid components in a power grid. The method comprises assessing a relative similarity of time series of measured voltage data of the grid components by clustering the time series of measured voltage data of the grid components; grouping the grid components into a plurality of clusters based on the assessing a relative similarity; and assessing a phase connection of the grid components in each cluster of the plurality of clusters.

Various embodiments may preferably implement the following features:

The power grid preferably comprises or is a transmission grid and/or a distribution grid.

The grid component preferably comprises or is a load, an electricity meter connected to a load, a capacitor, a capacitor bank, a voltage regulator, and/or a transformer.

Preferably, the method comprises receiving the time series of measured voltage data of the grid components. Preferably, the time series of measured voltage data of the grid components are received from the respective grid component of the plurality of grid components or from a meter connected to the respective grid component of the plurality of grid components.

Preferably, the time series of measured voltage data of a grid component comprises one or more samples at different times. The samples may preferably have a certain time length.

Preferably, the assessing a phase connection is based on determining a majority of a reference phase connection of the grid components in at least one cluster of the plurality of clusters. Preferably, the method comprises assessing the phase connection of the majority to be the phase connection of the grid components in the at least one cluster. Preferably, the reference phase connection of a grid component is from a database, e.g. a GIS database. In other words, the reference phase connection of a grid component may be an information about the phase connection that has been previously stored.

Preferably, the assessing a phase connection is determined based on a similarity value between at least one part of the time series of measured voltage data of at least one grid component having a verified phase connection in at least one cluster of the plurality of clusters and at least one part of the time series of measured voltage data of at least one other grid component in the at least one cluster. Preferably, the method comprises assessing the verified phase connection to be the phase connection of the grid components in the at least one cluster if the similarity value is above a predefined threshold. It is known to the skilled person that a similarity value may be a value that quantifies the similarity between variables, here between the at least one part of the time series of measured voltage data of at least one grid component having a verified phase connection in at least one cluster of the plurality of clusters and at least one part of the time series of measured voltage data of at least one other grid component in the at least one cluster. The similarity value may be a correlation value which is known to the skilled person to quantify the strength of the relationship between variables. The verified phase connection may preferably be provided by a grid provider. For example, the verified phase connection may be of a transformer or a capacitor which belongs to the grid provider. In other words, a verified phase connection may be a phase connection which is known to be true.

Preferably, the method comprises calculating a similarity value between at least one part of the time series of measured voltage data of at least one grid component in at least one cluster of the plurality of clusters and at least one part of the time series of measured voltage data of at least one grid component in another cluster of the plurality of clusters. Preferably, the method comprises categorizing the at least one grid component from the at least one cluster into the other cluster of the plurality of clusters if the similarity value is above a predefined threshold. Preferably, the method comprises reassessing the phase connection of the grid components in said cluster and the other cluster.

Preferably, the method comprises determining a phase connection of the grid components based on the assessing a phase connection of the grid components. Preferably, the method comprises determining a phase connection of the grid components based on the assessing a phase connection of the grid components and/or the reassessing the phase connection of the grid components.

The calculating and the categorizing are preferably repeated until the number of grid components having a similarity value above said threshold is above a predefined number.

Preferably, the assessing a relative similarity is performed using a dimensionality reduction on the time series of measured voltage data of the grid components, in particular a non-linear dimensionality reduction on the time series of measured voltage data of the grid components.

The method preferably further comprises automatically determining at least one parameter of the clustering, in particular wherein the at least one parameter is a number of clusters and/or a parameter for a similarity metric of the clustering.

Preferably, the automatically determining at least one parameter is performed using a cluster validity index, in particular maximizing and/or minimizing the cluster validity index, more particular a Calinski-Harabasz index, a Silhouette index, or a Davies-Bouldin index.

The time series of measured voltage data of all grid components are preferably divided into a plurality of time segments. Preferably, each time segment comprises measured voltage data of all grid components. Preferably, the assessing a relative similarity and the grouping the grid components into clusters is performed for each time segment, preferably for each time segment separately.

Preferably, the time segments are overlapping or non-overlapping.

The method preferably comprises assessing the phase connection of the grid components over at least one part of the time segments in at least one cluster of the plurality of clusters based on determining a majority of an assessed phase connection of the grid components of the at least one part of the time segments. Preferably, the method comprises assessing the phase connection of the majority to be the phase connection of the grid components in the at least one cluster.

Preferably, the method comprises balancing electrical power between phases of at least one part of the grid components based on the determining a phase connection.

Preferably, the method comprises detecting a failure of at least one grid component of the grid components based on the determining a phase connection.

Preferably, the method comprises determining a failure of a previously determined phase connection of at least one grid component of the grid components based on the determining a phase connection.

Preferably, the method comprises determining a configuration of the power grid based on the determining a phase connection based on the determining a phase connection.

Preferably, the method comprises, before the assessing a relative similarity, correcting at least one of: missing data, measurement noise, synchronization errors or bias errors of the time series of measured voltage data of the grid components.

Preferably, the method comprises, before the assessing a relative similarity, normalizing the time series of measured voltage data of the grid components before the assessing a relative similarity.

The present disclosure also relates to a device for determining phase connections of grid components in a power grid. The device comprises a computer 1800, illustrated in FIG. 18, that includes a memory 1810, in particular a non-transitory memory, for storing computer instructions and a processor 1820 in communication with the memory 1810, wherein, when the processor 1820 executes the computer instructions, the processor 1820 is configured to carry out the method as described above.

The present disclosure also relates to a computer program product comprising instructions which, when the program is executed by a computer, cause the computer to carry out the method as described above.

The exemplary embodiments disclosed herein are directed to providing features that will become readily apparent by reference to the following description when taken in conjunction with the accompanying drawings. In accordance with various embodiments, exemplary systems, methods, devices and computer program products are disclosed herein. It is understood, however, that these embodiments are presented by way of example and not limitation, and it will be apparent to those of ordinary skill in the art who read the present disclosure that various modifications to the disclosed embodiments can be made while remaining within the scope of the present disclosure.

Thus, the present disclosure is not limited to the exemplary embodiments and applications described and illustrated herein. Additionally, the specific order and/or hierarchy of steps in the methods disclosed herein are merely exemplary approaches. Based upon design preferences, the specific order or hierarchy of steps of the disclosed methods or processes can be re-arranged while remaining within the scope of the present disclosure. Thus, those of ordinary skill in the art will understand that the methods and techniques disclosed herein present various steps or acts in a sample order, and the present disclosure is not limited to the specific order or hierarchy presented unless expressly stated otherwise.

BRIEF DESCRIPTION OF THE DRAWINGS

The above and other aspects and their implementations are described in greater detail in the drawings, the descriptions, and the claims.

FIGS. 11a-c show a categorizing of a grid component into another cluster according to an embodiment of the present disclosure.

DETAILED DESCRIPTION

In the following, exemplary embodiments of the disclosure will be described. It is noted that some aspects of any one of the described embodiments may also be found in some other embodiments unless otherwise stated or obvious. However, for increased intelligibility, each aspect will only be described in detail when first mentioned and any repeated description of the same aspect will be omitted.

Figure 1:
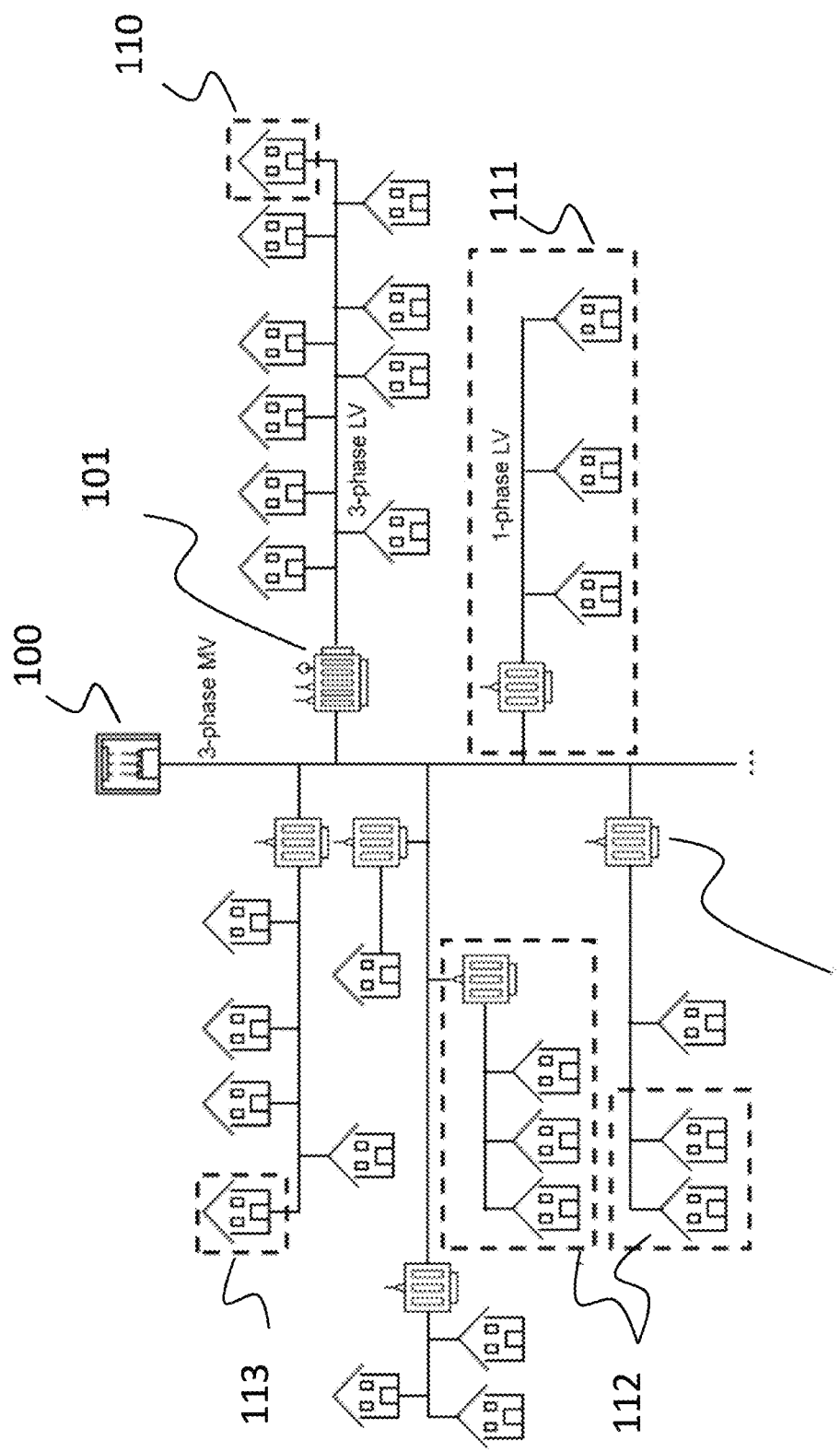
FIG. 1 shows an exemplary power grid having different incorrectly determined phased connections.

FIG. 1 shows an exemplary power grid. The grid comprises a HV/MV (High-Voltage/Medium Voltage) substation 100, a 3-phase MV/LV (High-Voltage/Medium Voltage) transformer 101, and a 1-phase MV/LV transformer 102. In this exemplary power grid, one of the grid components 110 has a phase connection which does not correspond to the entry in the respective database. In addition, the grid components in the lateral depicted with 111 have phase connections which do not correspond with the entries in the respective database. The same applies to the grid components 112 and 113. As a result, the knowledge about the grid (configuration) is inaccurate resulting in an inaccurate grid model. Traditionally, improvement in the accuracy of the database, e.g. the GIS database, involves sending personnel into the field to do manual verification of the phase connections. However, depending on the system and the surrounding landscape, this may be a tedious and expensive task as accurately following overhead and underground lines may not be straightforward.

Figure 2:
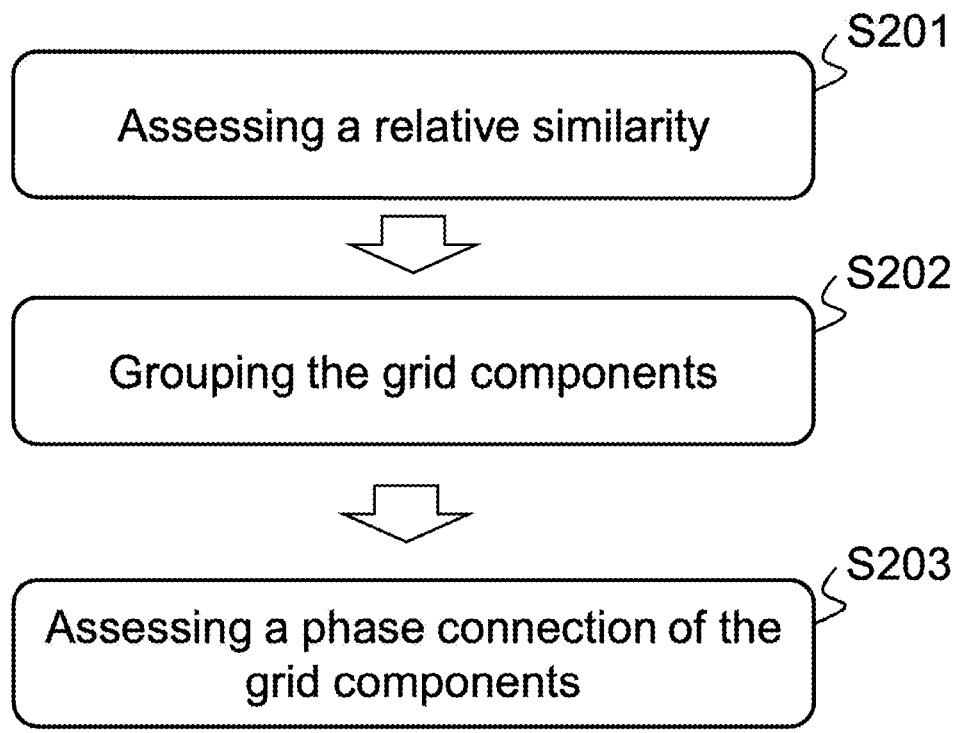
FIG. 2 shows a flowchart of a method according to an embodiment of the present disclosure.

FIG. 2 shows a flowchart of a method according to an embodiment of the present disclosure.

In S201, a relative similarity of time series of measured voltage data of the grid components by clustering the time series of measured voltage data of the grid components is determined.

According to an embodiment, time series of measured voltage magnitudes may be used as time series of measured voltage data. The input signals/input data for the method may be raw data or preprocessed data.

According to an embodiment, the time-series of measured voltage data are obtained from a plurality of grid components, e.g. loads, in particular from electricity meters located at end-consumer premises. Although the obtaining is not part of the method shown in the embodiment in FIG. 2, it is understood by the skilled person that the obtaining/receiving of the data is may also be part of certain embodiments of the present disclosure. These voltage measurements may be time-stamped with a measurement resolution interval of several minutes. The interval(s) may have a duration of at least one of: 15 minutes, 30 minutes, or 1 hour. However, the presented disclosure is not limited to the mentioned resolution intervals.

According to an embodiment, complex quantities of measured voltage data are available in Cartesian or polar representation, and the voltage data to be processed in the methods according to the present disclosure, e.g. voltage magnitudes, can be calculated accordingly.

Figure 3:
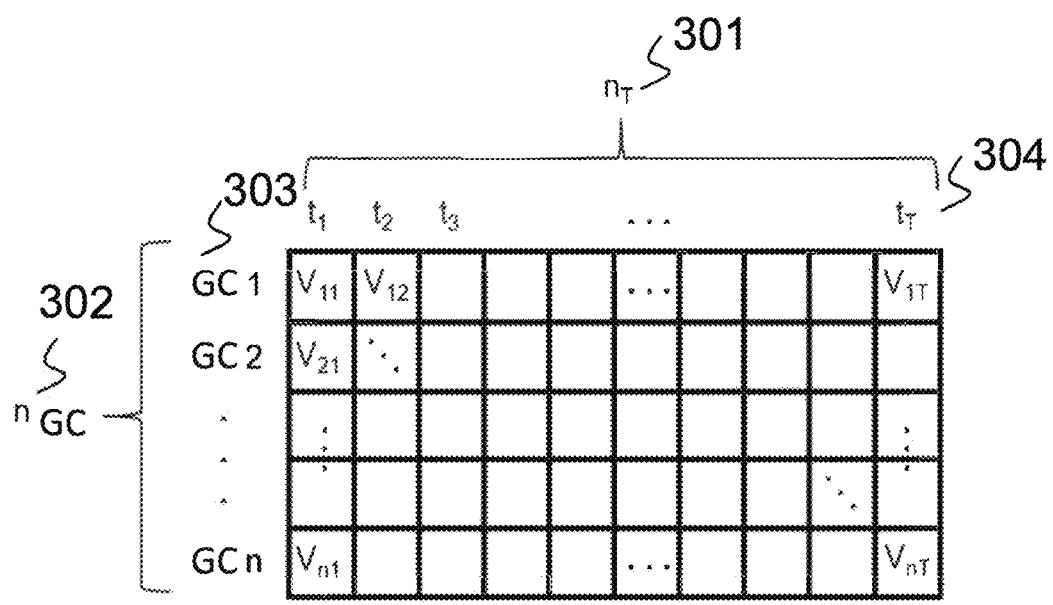
FIG. 3 shows an exemplary measured voltage input matrix according to an embodiment of the present disclosure.

In the embodiment shown in FIG. 2, the time series of measured voltage data of a grid component comprises several samples at different times. The samples may have a certain time length. However, the present disclosure is not limited to this, and each time series may have only one sample. Having several grid components, e.g. loads, and having time series of measured voltage data comprising several samples may result in a measured voltage input matrix V having the dimension $n_{GC} \times n_T$, where $n_{GC}$ is the number of grid components GC and $n_T$ is the number of samples in the time series. An exemplary measured voltage input matrix V is shown in FIG. 3. The measured voltage input matrix V comprises for each grid component 303 of the number $n_{GC}$ 302 of grid components voltage measurements V at different times $t_1$ to $t_T$ 304. In other words, for each grid component 303 of the number $n_{GC}$ 302 of grid components, the time series of measured voltage data 301 comprises different samples at different times 304. The data structure is shown as a matrix; however, any other suitable data structure may be used.

In an embodiment of the present disclosure, time series of voltage measurement data from other parts of the grid, e.g. other grid components may be used to increase the accuracy and robustness of the methods of the present disclosure. Such time series of voltage measurement data may correspond to the grid component voltage measurements in all dimensions, e.g. time resolution and data quantity.

Figure 4:
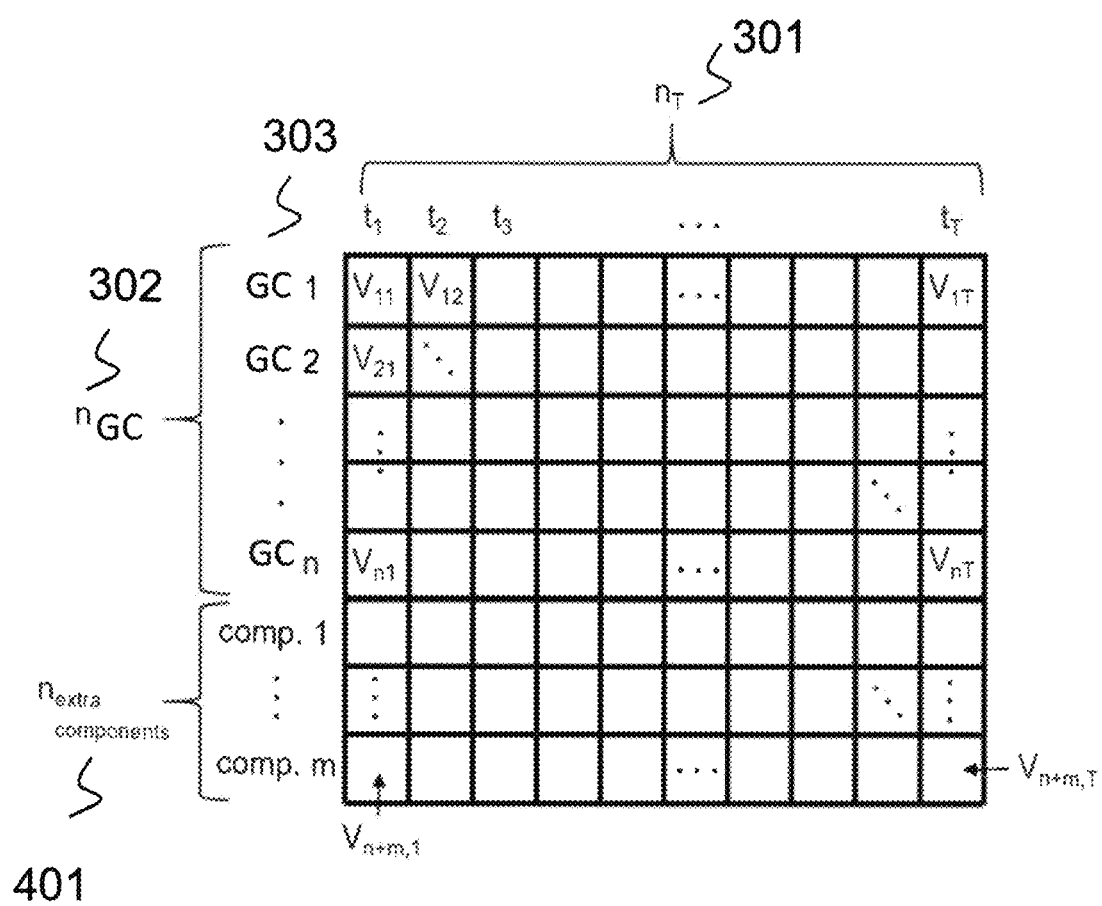
FIG. 4 shows an extended exemplary measured voltage input matrix according to an embodiment of the present disclosure.

According to an embodiment, if the measurement interval is smaller and thus the number of samples is higher, the time series of voltage measurement data should be averaged to the same interval size. An embodiment of the present disclosure, an extended measured voltage input matrix V with additional time series of voltage measurement data from other parts of the grid is shown in FIG. 4. In FIG. 4, the measured voltage input matrix V is extended by m further times series of extra components 401.

In an embodiment of the present disclosure, preprocessing may be performed on the time series of voltage measurement data to remove gross errors. For example, the time series of voltage measurement data may contain a range of errors including, among others, missing data, measurements noise, synchronization errors and meter bias errors. In the preprocessing, missing data values may be interpolated, whereas other errors may not have to be corrected. According to an embodiment, in order not to exclude data points where measurement data is missing, the data point may be interpolated based on the surrounding measurement points. Additionally, or alternatively, additional information is used to further clean the time series of voltage measurement data, e.g. meter accuracy class information can be used to perform noise cancellation and estimate the signal without measurement noise.

In an embodiment of the present disclosure, further preprocessing is performed by mean-normalization of the voltage measurement data, e.g. rescaling the data to have zero mean value and range [−1,1]. This step may be performed in order to increase the overall accuracy. For example, for each voltage time-series, the mean, maximum, and minimum value may be calculated, and the measurement data may be normalized according to:

$$\vec{V}' = \frac{\vec{V} - \text{mean}(\vec{V})}{\max(\vec{V}) - \min(\vec{V})}$$

where $\vec{V}$ is the vector with original voltage measurement data, and $\vec{V}'$ is the normalized vector.

Figure 5:
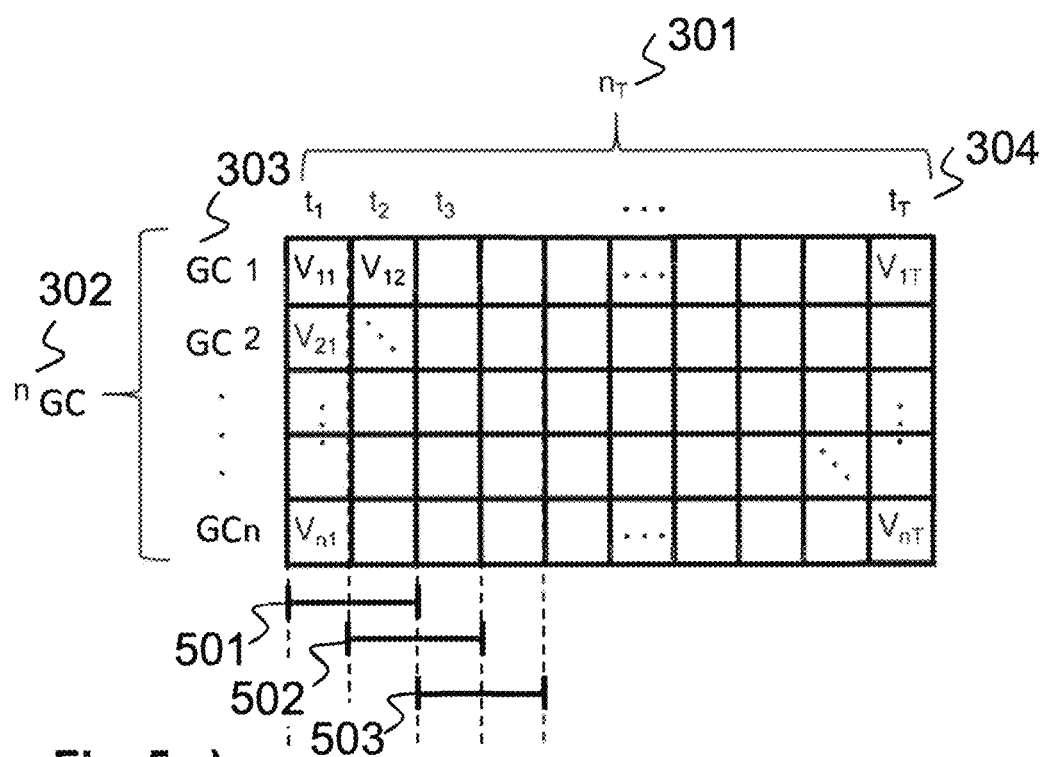
FIGS. 5a and 5b show exemplary measured voltage input matrices with time segmentation according to an embodiment of the present disclosure.
Figure 5:
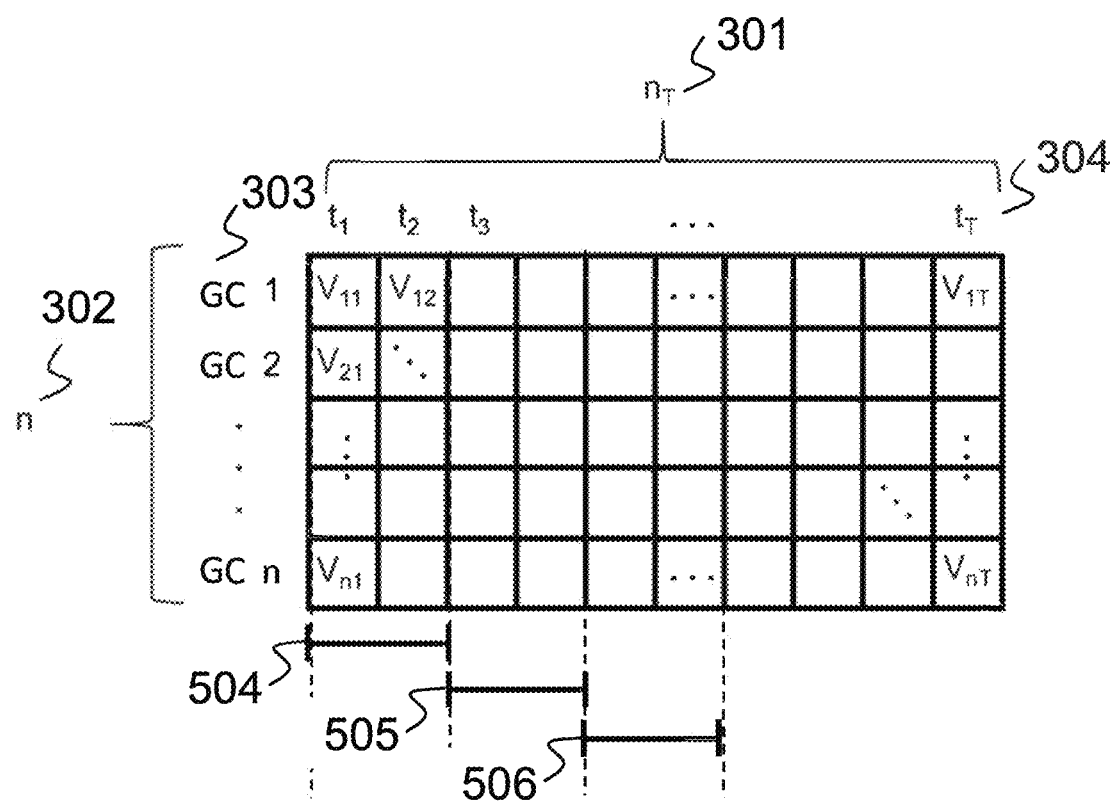

In an embodiment of the disclosure, the time series of voltage measurement data 301 are divided into time segments, as shown in FIGS. 5a and 5b. However, it is understood by the skilled person that the present disclosure is not limited to this division into time segments. According to an embodiment, each time segment comprises measured voltage data of all grid components under consideration. In other words, when considering the measured voltage input matrix V, the division into time segments is performed column-wise. FIG. 5a shows the voltage input matrix V with overlapping time segments 501, 502, and 503, also referred to as a sliding window, and FIG. 5b shows the measured voltage input matrix V with non-overlapping time segments 501, 502, and 503, also referred to as a tumbling window.

In an embodiment of the disclosure, the division into time segments may be dependent on the amount of available data and measurement time resolution. The size of a time segment may range from only several time instances to hundreds or thousands of instances per time segment. The choice of the time segment size may represent a trade-off between the data amount which must be kept in a memory, computational time, and confidence in the final assessment. According to an embodiment, the time segment size may be in the range of hours or days and may depend on the time resolution.

As mentioned above, the relative similarity of time series of measured voltage data of the grid components is assessed by clustering the time series of measured voltage data of the grid components.

In the following, an embodiment of the present disclosure is described where the time series of measured voltage data are divided into time segment and where spectral clustering is used for the assessing a relative similarity of the time series of measured voltage data of the grid. However, it is understood by the skilled person that present disclosure is not limited to the use of spectral clustering and the division into time segments.

The spectral clustering is based on a nonlinear dimensionality reduction (but also other clustering methods using a nonlinear dimensionality reduction are known to the skilled person and may be used). The spectral clustering according to an embodiment comprises:

Creating an affinity (similarity) matrix A from the measured voltage input matrix V, wherein the affinity matrix represents the measure of similarity between all combinations of two voltage time-series. The affinity matrix can be constructed using various approaches including but not limited to Pearson correlation factor, radial basis functions (RBF), or linear/polynomial/cosine pairwise kernels. In the following, exemplary results are given for an affinity matrix construction using an RBF kernel as follows:

$$A_{ij} = e^{-\gamma \ast \|V_i - V_j\|^2}$$

where $\|V_i - V_j\|^2$ represents the squared Euclidean distance between a pair of voltage measurements, and $\gamma$ is the similarity parameter.

Executing normalized Laplacian transformation of the affinity matrix as follows:

$$L = I - D^{-1/2} A D^{-1/2}$$

where I is the identity matrix, and D is the degree matrix ($D = \Sigma_j A_{ij}$).

Performing eigen decomposition of the Laplacian matrix L, and select the first n eigenvectors corresponding to the largest eigenvalues. These are further used as representative feature vectors for further clustering, e.g. k-means clustering or using a Gaussian Mixture Model or the like. Eigenvalues $\lambda$ and eigenvectors x are computed such that:

$$Lx = \lambda x$$

According to an embodiment, to speed up the procedure, partial eigen decomposition can be performed by only computing the first n eigenvectors corresponding to the largest eigenvalues.

Performing subsequent clustering, e.g. k-means clustering or a Gaussian Mixture Model or the like, on the computed eigenvectors.

It is one concept of the disclosure, that tuning/determining at least one parameter of the clustering, in particular a hyperparameter of the spectral clustering hyperparameters is performed automatically. E.g., according to an embodiment of the present disclosure, the optimal number of clusters $n_{cl}$ as well as the optimal parameters for the similarity metric, e.g. γ for the RBF calculation of the affinity matrix are automatically chosen. This allows the disclosure to be easily applied to a range of power grids and available measurement data without extensive manual expert tuning.

In an embodiment of the disclosure, the determining/tuning of at least one parameter of the clustering, e.g. an optimal hyperparameter, is performed using an internal cluster validity index. According to an embodiment, a Calinski-Harabasz index, is used which relies on the between-cluster and within-cluster variations. However, in general, other internal validity indices can also be used, e.g. Silhouette index, Davies-Bouldin index, etc.

According to an embodiment, the automatic (hyper)parameter tuning/determining is performed as follows:
(1) Choosing a range of values for hyperparameters which should be tuned. The similarity parameters should cover several orders of magnitude, e.g. $\{2^{-11}, 2^{-9}, \ldots 2^1\}$. The minimum number of clusters may be set to 3.
(2) For the chosen time-series of voltage measurements, calculating the affinity matrix and the corresponding Laplacian transformation. The chosen voltage time-series can be either the whole time-series or selected part(s) of it.
(3) Perform (partial) eigen-decomposition of the Laplacian matrix.
(4) For each combination of hyperparameters, choose the corresponding number of eigenvectors and perform subsequent clustering, e.g. k-means clustering or using a Gaussian Mixture Model or the like. Calculate the internal validity score based on the obtained clusters.
(5) Choose the optimal hyperparameters based on the extreme value of the internal validity score. Depending on which index was used, either the maximum or minimum value is the optimum, e.g. the maximum value is used for the Calinski-Harabasz index.

Figure 6:
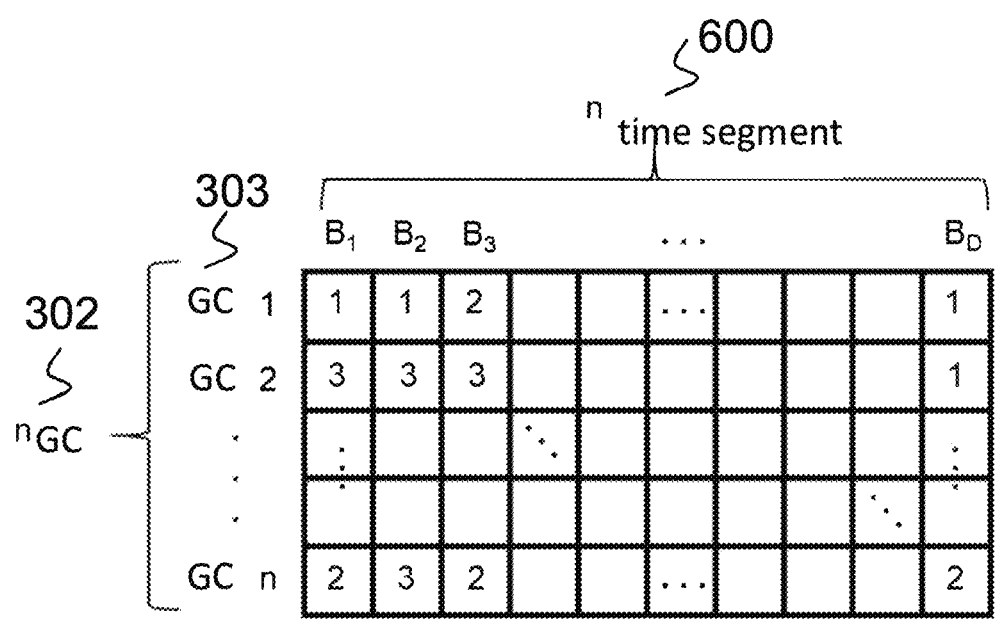
FIG. 6 shows an output matrix of a clustering according to an embodiment of the present disclosure.

Final output of the (spectral) clustering is a matrix, as shown in FIG. 6, whose dimension is the number of grid components 302 x number of time segments 600, $n_{grid\ components} \times n_{time\ segments}$, and where an entry of the matrix corresponds to the cluster for a grid component 301 and the respective time segment.

In other words, the grid components 303 are grouped into a plurality of clusters based on the assessing a relative similarity, S202.

Please note that the matrix in FIG. 6 shows for each entry belonging to one of the grid components 303 at a respective time segment of the time segments 600 values "1", "2", or "3", where the value corresponds to the cluster for the grid component 303 at each time segment. It is understood by the skilled person that the values "1", "2", or "3" are merely for illustration, any suitable naming/numbering scheme may be applied.

In S203, a phase connection of the grid components in each cluster of the plurality of clusters is assessed. In other words, per cluster, all grid components in each cluster are assessed to have a same phase connection. In this context it should be emphasized again that in the present disclosure the term "phase connection" generally refers to how the phases of a grid component are connection. In other words, the term "phase connection" does not only refer to a single-phase connection, e.g. a connection with a live wire and with or without a neutral wire, but also to a poly-phase connection, e.g. a connection with two or more live wires and with or without a neutral wire. For example, if the phases are denoted with "a", "b", and "c", the term "phase connection" in the present disclosure refers to both single-phase connections, i.e. "a", "b", "c", and poly-phase connections, i.e. "ab", "ac", "bc" and "abc". It is also understood by the skilled person that the term "phase connection" does not give any spatial indication, i.e. the term does generally give no indication about the location of the connection.

Figure 7:
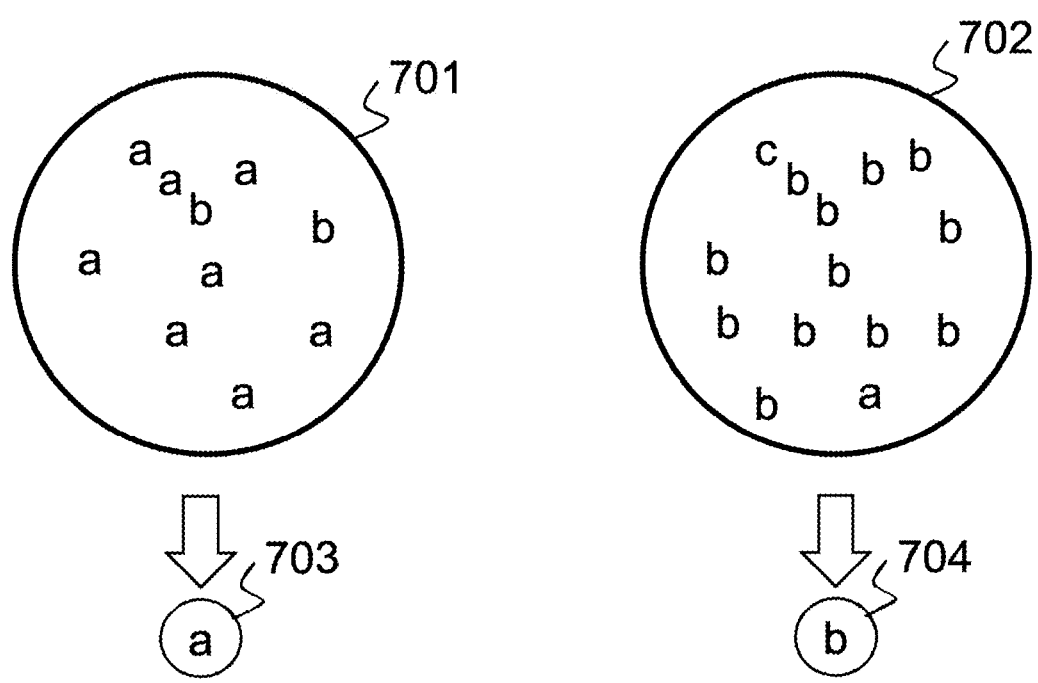
FIG. 7 shows an example of a majority vote according to an embodiment of the present disclosure.

According to an embodiment, the assessing a phase connection is based on determining a majority of a reference phase connection of the grid components in a cluster. In other words, there is knowledge about a reference phase connection for all or at least a part of the grid components in the cluster. Such a reference phase connection may be intaken from a database, e.g. a GIS database. However, as mentioned above, said reference connections, in particular from a database might be incorrect, e.g., due to poor quality of the database, and might not reflect the real status of the phase connection of the respective grid component. An example of such a majority vote is illustrated in FIG. 7 with two exemplary clusters 701 and 702. In cluster 701 cluster reference phase connections "a" and "b" are shown and in cluster 702 reference phase connections "a", "b" and "c" are shown, but it is understood that this is merely for illustration. In cluster 701, there are 10 grid components with reference connections. 8 grid components have a reference phase connection "a" and 2 grid components have a reference phase connection "b". Thus, the majority for cluster 701 is a reference phase connection "a". It is then assessed that the phase connection of the grid components in cluster 701 be phase connection "a", 703. In cluster 702, the majority is a reference phase connection "b", 704, and this reference phase connection is assessed to be the phase connection for the grid components in cluster 702.

As an alternative or in addition to assessing the majority of a reference phase connection, according to an embodiment of the present disclosure, the assessing a phase connection is based on a similarity value between at least one part of the time series of measured voltage data of at least one grid component having a verified phase connection in a cluster and at least one part of the time series of measured voltage data of at least one other grid component in the cluster. For example, if grid components are known to have a verified phase connection, e.g. because these grid components belong to a grid provider who has manually checked the phase connection, similarity values, e.g. a correlation values, may be calculated between voltage measurements of these grid components and other grid components in the cluster. If a similarity value is above a predefined threshold, it is assessed that the respective verified phase connection be the phase connection of the grid components in the cluster. The assessing may also be performed based on the highest similarity value.

Figure 8:
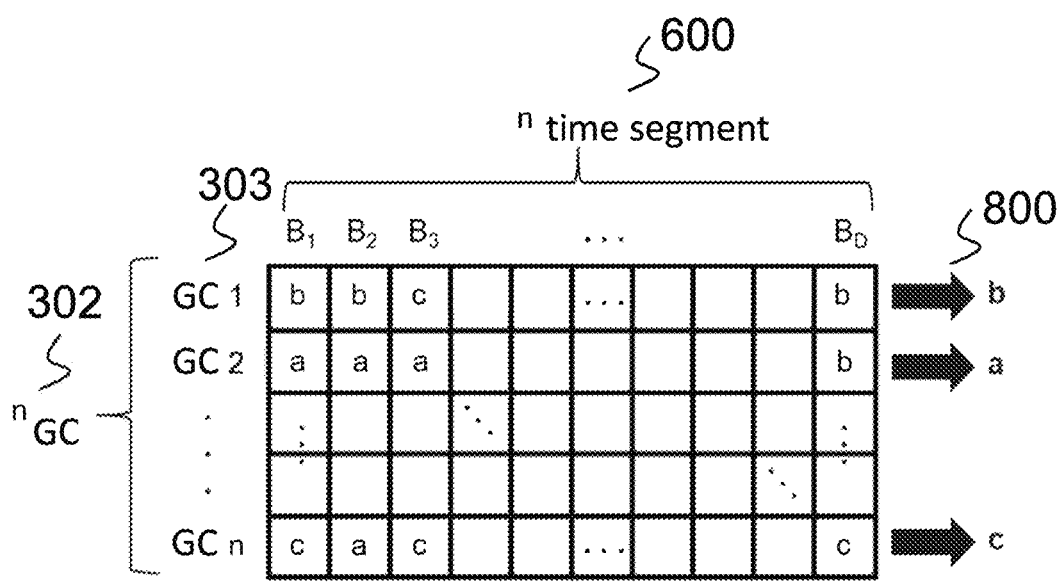
FIG. 8 shows an example of a further majority vote according to an embodiment of the present disclosure.

In case, a division into time segments has been performed, the above described assessing a phase connection is performed over all time segments. Alternatively, the above described assessing a phase connection is performed over at least one part of the time segments, and the rest of the time segments may be discarded. A further majority is determined, i.e. a majority of the assessed phase connection of the grid components of each time segment, or, in the alternative above, of the at least one part of the time segments. The determined majority of the assessed phase connection is then assessed to be the phase connection of the respective grid component in the cluster. FIG. 8 illustrates exemplarily such a further majority "vote". For each grid component 303 and time segment 600 a phase connection "a", "b", or "c" is assessed and based on the majority vote a phase connection 800 for the respective grid component is obtained. For example, in case of 10 time segments, one phase connection is assessed 9 times to be "b" and once to be "c", the "final" assessed would be the one corresponding to the phase connection of the majority, phase connection "b".

According to an embodiment, a phase connection of the grid components is determined based on the assessing a phase connection of the grid components. These determined phase connections may then be compared to respective entries in a database, i.e. with the information about the phase connections in the database. Since the true phase connection may be unknown, one may not easily evaluate, whether the detected errors are due to incorrect reference phase connections or incorrect phase determinations. Therefore, in an embodiment of the disclosure, to estimate how trustworthy the determination is, a confidence score for each or at least part of the assessed phase connection is calculated. In other words, according to an embodiment, a confidence score is calculated for the phase connection of the grid components in a cluster based on the occurrence of the phase connection of the grid components in the time segments.

In an embodiment of the disclosure, a confidence score for the assessment of the phase connections of the grid components is based on the occurrence of assessed phase connections across different time segments and may be defined as the number of a particular phase connection assessment divided by the number of time segments. Formally, for a multiset S, which contains assessed phase connections from all time segments for a given grid component, the confidence $C_p$ of an assessed phase connection p is given by:

$$C_p = \frac{1}{|S|} \sum_{s \in S} 1_p(s)$$

where $1_p(s)$ is the indicator function, i.e. it equals 1 if p=s.

Such a confidence score is an indication of how trustworthy the assessed phase connection is, i.e. how consistently the grid component is assessed to have a particular phase connection across all the time segments. Using the sliding window compared to the tumbling window will result in a higher number of time segments and typically a higher confidence score. It is understood by the skilled person that also other approaches to calculate a confidence score are known to the skilled person, e.g. using an average likelihood that a grid component belongs to a certain cluster.

In the example above where one phase connection is assessed 9 times to be "b" and once to be "c", the confidence score would be 90% for "b" and 10% for "c". A high confidence score may indicate that the method of the present disclosure is consistently assessing the same phase connection, but it may not necessarily mean that the phase connection is correct. However, the confidence score will intrinsically be lower for grid components which are not strongly correlated and are therefore more likely to be misclassified. It is within the skilled person's knowledge how to define an acceptable threshold for the "trustworthiness".

According to the disclosure, the above described clustering provides assessment of phase connections of sufficient accuracy and confidence. However, in some grids, due to the above majority vote rule, the grid components whose occurrence is low compared to other phase connection types may be misclassified.

For instance, if only few poly-phase connections are present in a large grid with thousands of single-phase grid components, these will most likely be misclassified as single-phase grid components. Therefore, according to an embodiment, further (subsequent) clustering, e.g. multi-tree clustering, may be performed as a second step to improve the accuracy and robustness of the overall approach.

Such further clustering may be based on iteratively adding grid components, whose profiles are the most correlated to the profiles of grid components which are already contained in the cluster.

According to an embodiment of the present disclosure, for the aforementioned further clustering possible clusters are first initialized. The possible phase connection clusters may include both single-phase connections, i.e. "a", "b", "c", and poly-phase connections, i.e. "ab", "ac", "bc" and "abc".

In an embodiment of the disclosure, possible clusters of the further clustering, e.g. multi-tree clustering, may be initialized. The initializing can be performed in several ways, one example is shown below:

(1) Using the results of the first clustering, as exemplary described above using spectral clustering, where the clusters are initialized with voltage measurements of grid components whose assessed phase connection equals the possible cluster phase connection, whose confidence score is above a selected threshold value, and, optionally, whose assessed phase connection equals the reference phase connection. In this context it should be noted that the confidence score can be calculated as described above but is not limited to it. The confidence score may, e.g., also be calculated using an average likelihood that a grid component belongs to a certain cluster.

(2) In addition to the initialization from item (1), voltage measurements from other grid components whose phase connection is known to be true, i.e. they are verified, e.g. voltage regulators or transformers, may be used.

In an embodiment of the disclosure, the first step of initializing the possible phase connection clusters is to add voltage measurements from item (1) to the corresponding cluster based on the assessed phase connection. It is noted that some clusters may be empty after this step is performed, for instance if only single-phase grid component predictions have the confidence score above the set value. In such case, the empty poly-phase clusters may be initialized according to the single-phase measurements which are known to be measured at the same electrical node.

Figure 9:
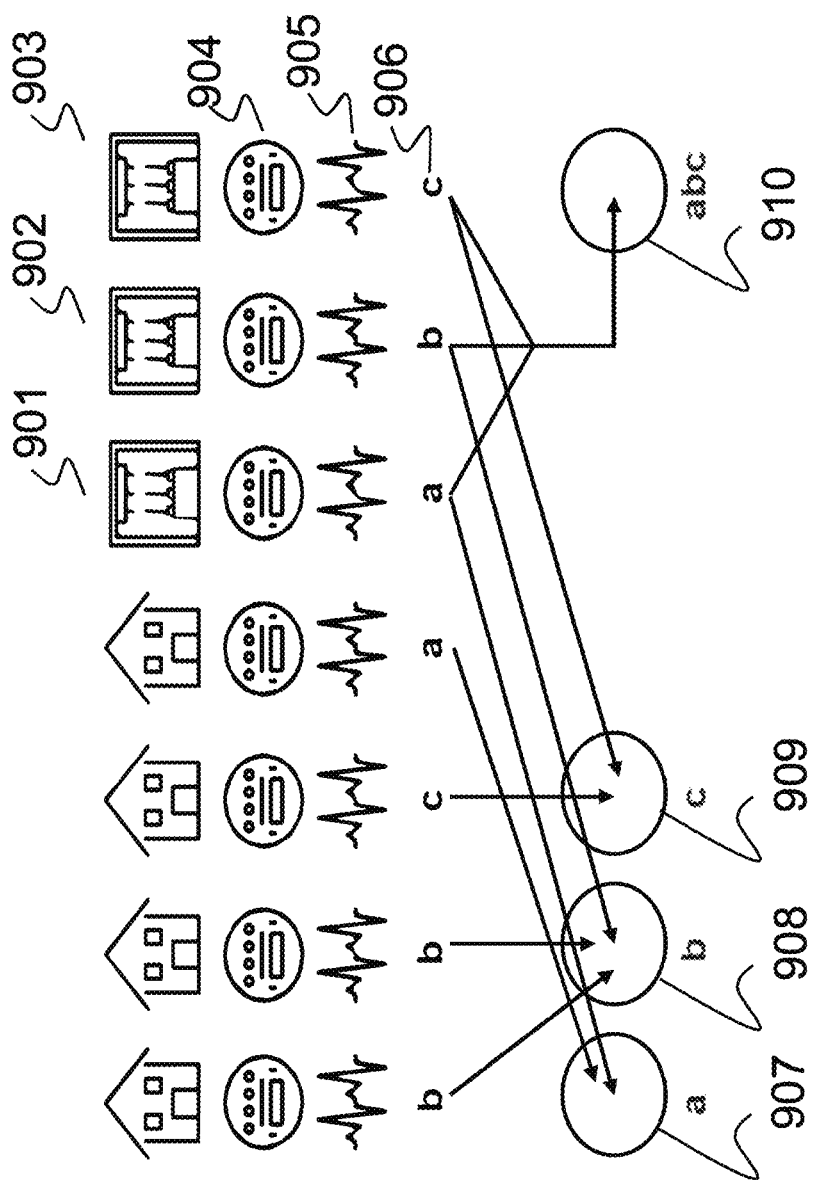
FIG. 9 shows an example of an initialization of clusters according to an embodiment of the present disclosure.

FIG. 9 illustrates an example of initializing the multi-tree clusters according to an embodiment of the disclosure. Single-phase clusters 907, 908, and 909 are initialized with single-phase measurements, and a poly-phase cluster 910 is initialized with the average of single-phase measurements. Respective single-phase measurements 906, respective voltage measurements 905, and respective measurement devices 904 are shown. In particular for each phase 901, 902, and 903 of a HV/MV substation a single-phase measurement is performed.

As an example, shown in FIG. 9, single-phase voltage measurements at the medium voltage side of the HV/MV substation can be used to initialize the three-phase cluster by calculating the average voltage across the three phases and setting it as initial voltage measurement.

Figure 10:
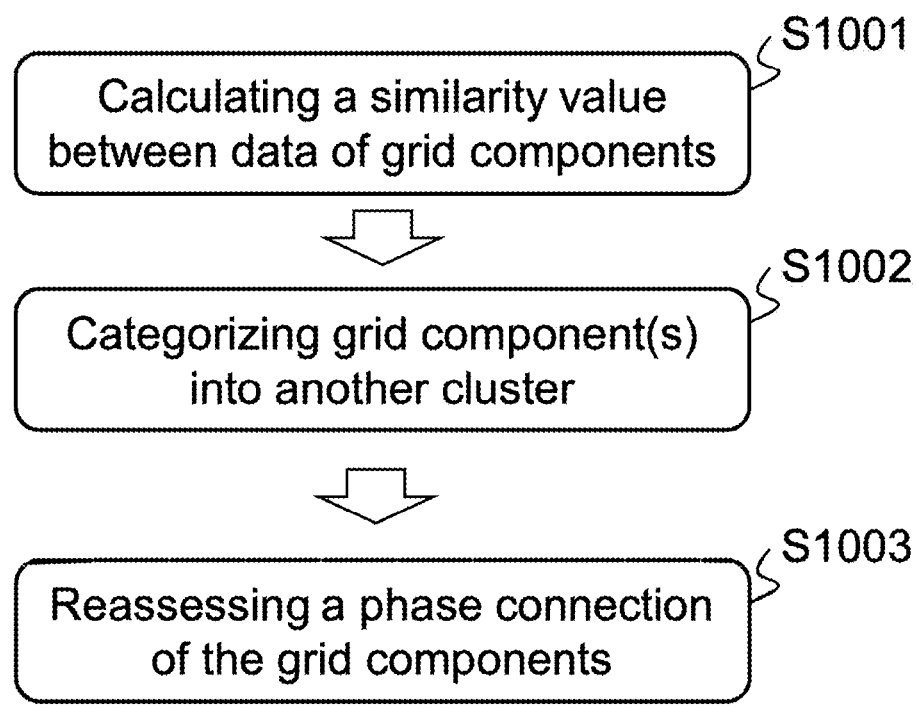
FIG. 10 shows a flowchart of a method according to an embodiment of the present disclosure, in particular a further clustering after first clustering.

FIG. 10 shows a flowchart of a further clustering after the above described (spectral) clustering.

After the initialization, if performed, a similarity value between at least one part of the time series of measured voltage data of at least one grid component in at least one cluster of the plurality of clusters and at least one part of the time series of measured voltage data of at least one grid component in another cluster of the plurality of clusters is calculated, S1001.

According to an embodiment, for one or more, e.g. each, grid component(s) i whose confidence score is below a set/predefine threshold value, the minimum distance to each (initialized) cluster is computed. Please note that the confidence score may be from the previous clustering mentioned above or another method of calculating a confidence score, e.g. using an average likelihood that a grid component belongs to a certain cluster. The minimum distance may be computed based on the highest similarity value, e.g. a correlation value/coefficient between the measurement data of the selected grid component and measurement data from other grid component(s), e.g. all grid components, already categorized/grouped into the cluster. A formal expression may be:

$$d_{min} = 1 - \max_k \left( \frac{cov(V_i, V_j)}{\sigma_{V_i} \sigma_{V_j}} \right), \forall V_j \text{ in } k \in n_{clusters}$$

with $V_i$ and $V_j$ being the voltage measurements from grid components i and j, respectively; $n_{clusters}$ being the total number of clusters and k being the cluster index; $cov(V_i, V_j)$ being the covariance between voltage measurements $V_i$ and $V_j$; and $\sigma_{V_i}$ and $\sigma_{V_j}$ being the standard deviations of voltage measurements $V_i$ and $V_j$, respectively.

In S1002, at least one grid component from the at least one cluster is categorized into another cluster of the plurality of clusters if the similarity value is above a predefined threshold. In other words, the selected grid component is added to another cluster if the similarity between the data of the selected grid component and the data of one or more grid components of another cluster is above a predefined threshold, e.g. when the selected grid component has the minimum calculated distance to the other cluster.

An example of such a categorizing/regrouping into another cluster is exemplarily shown in FIG. 11a to c. As shown in FIG. 11a and FIG. 11b, the measured data, e.g. the measured voltage data, 1101 from a grid component is compared to the measured data of grid components in the clusters 1100, and the corresponding correlation coefficient 1102 is calculated. Then, as shown in FIG. 11c, the minimum distance 1103 is calculated based on the correlation coefficient and the grid component is categorized to the cluster 1104 with the minimum distance.

According to an embodiment, the procedure of S1002 is repeated until a certain number or all grid components of a cluster with a similarity value above a certain threshold are categorized into another cluster.

In S1003, the phase connection of the grid components in the cluster and the other cluster are reassessed. In other words, at least the phase connection of the grid components in the cluster from which a categorized cluster is taken and the phase connection of the grid components in the other cluster into which the grid component is categorized is reassessed. However, the present disclosure is not limited to this, and also a reassessment of other clusters can be performed, e.g. all clusters.

The reassessing may be performed as the previous assessing described above. E.g., according to an embodiment, the reassessing a phase connection is based on determining a majority of a reference phase connection of the grid components in the cluster. As an alternative or in addition to reassessing the majority of a reference phase connection, according to an embodiment of the present disclosure, the assessing a phase connection is based on a similarity value between at least one part of the time series of measured voltage data of at least one grid component having a verified phase connection in the cluster and at least one part of the time series of measured voltage data of at least one other grid component in the cluster.

In case of a division into time segments, the reassessing may also comprise the above described assessing over all time segments or at least a part of it with subsequent majority determination. To avoid unnecessary repetition, full reference is made to the assessing above, in particular to the majority determination above.

According to an embodiment, a phase connection of the grid components is determined based on the assessing a phase connection of the grid components and the reassessing the phase connection of the grid components. As above, these determined phase connections can then be compared to respective entries in a database, i.e. with the information about the phase connections in the database.

According to an embodiment, in case a phase connection of the grid components is determined based on both the assessing a phase connection of the grid components and/or the reassessing the phase connection of the grid components, the results of the determination may be divided into several sets:

Grid components whose reference phase connection is equal to the assessed phase connection from the first (spectral) clustering, and whose confidence score for the assessed phase connection is larger than a defined threshold value. The determined phase connection for such loads equals the reference connection.

Grid components whose reference phase connection differs from the assessed connection from the first (spectral clustering), or whose confidence score for the assessed phase connection is smaller than the defined threshold value. In general, the (final) determined phase connection may be decided in many ways, including manual inspection, visual inspection based on street images from open-source maps, or completely relying on obtained data-driven results. If the latter is the case, for instance, the (final) determined phase connection for such grid components may be decided as follows:

If the reassessed phase connection equals to the (firstly) assessed phase connection from (spectral) clustering, the determined phase connection equals to the assessed and reassessed phase connection.

If the reassessed phase connection differs from the (firstly) assessed phase connection from (spectral) clustering, the determined phase connection may be the one with a higher confidence score. Such grid components may be additionally marked as potential candidates for further manual and/or visual inspection.

In the following, exemplary test results according to the present disclosure will be discussed. The exemplary results of the disclosure on an IEEE-8500 bus system are discussed. To simulate a realistic case, a time-series of real power measurements is added to the grid components, here loads, and a series of power flows is performed to extract corresponding voltage measurements. Then, various errors are added to the extracted voltage data including measurement noise, meter bias, synchronization errors, and missing data errors.

Finally, the input data for the testing of the proposed approach are:
 1 month of raw voltage measurements from load smart meters.
 reference labels for load smart meters with errors.

Before feeding the input signals to a method according to the present disclosure, raw voltage measurements have been pre-processed, i.e. missing data has been interpolated and the time-series have been mean normalized. After input data pre-processing, an automatic hyperparameter tuning is performed once on the full time-series using the Calinski-Harabasz internal score.

Figure 12:
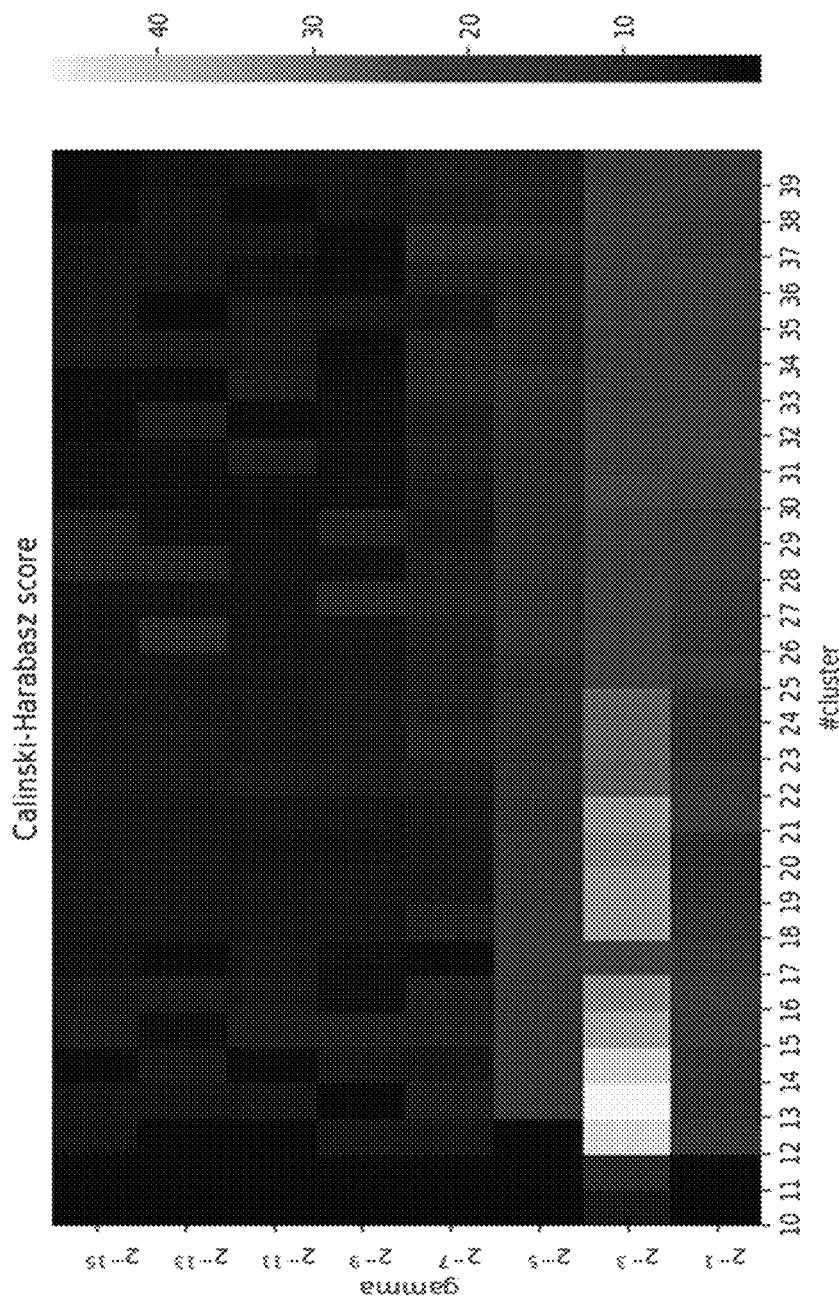
FIG. 12 shows a representation of a Calinski-Harabasz score for automatic tuning according to an embodiment of the disclosure.

FIG. 12 shows a representation of the Calinski-Harabasz score for automatic tuning, according to an embodiment of the disclosure, of the IEEE 8500-bus system. As shown in FIG. 12, values $\gamma=2^{-3}$ and $n_{cl}=13$ are chosen for further individual time segment clustering.

Figure 13:
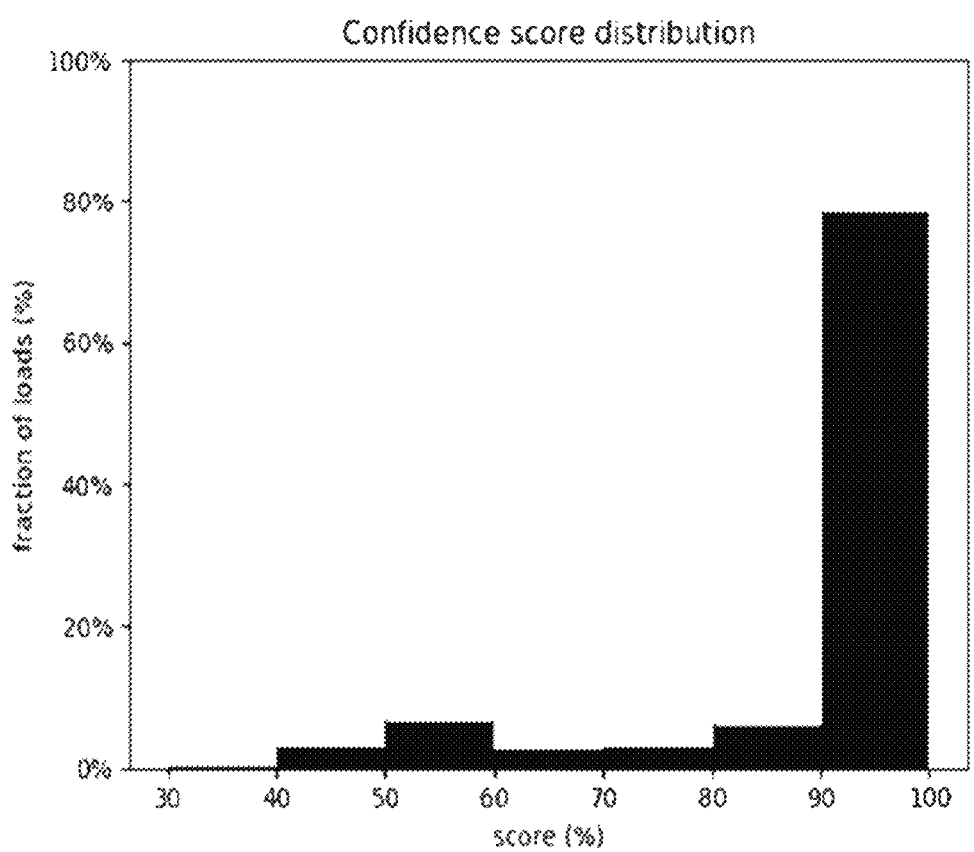
FIG. 13 shows a distribution of confidence scores for determined phase connections after spectral clustering using a sliding window according to an embodiment of the disclosure.

FIG. 13 shows a distribution of confidence scores for determined phase connections after spectral clustering using sliding window, according to an embodiment of the disclosure, of the IEEE 8500-bus system. As exemplarily depicted in FIG. 13, the overall prediction accuracy after spectral clustering clustering equals to 98.0% with majority of assessed phase connections having a confidence score above 90%. More precisely, ~86% of the assessed phase connections have a confidence score above 90%.

Out of these ~86% of the grid components, ones whose assessed phase connection is equal to a reference phase connection have been flagged as trustworthy grid components and further used for initializing the multi-tree clustering. 76% of total grid components are considered to be trustworthy. Therefore, their determined phase connection equals to the assessed phase connection from spectral clustering, and the reference phase connection.

The determined phase connection of the remaining 24% is determined based on the results of multi-tree clustering. After the multi-tree clustering, the phase connection determination accuracy is 98.1% with majority of the errors around the head of the observed feeder. If additional single-phase voltage measurements from the substation are used to initialize the multi-tree clusters, final accuracy rises to 99.6%.

Figure 14:
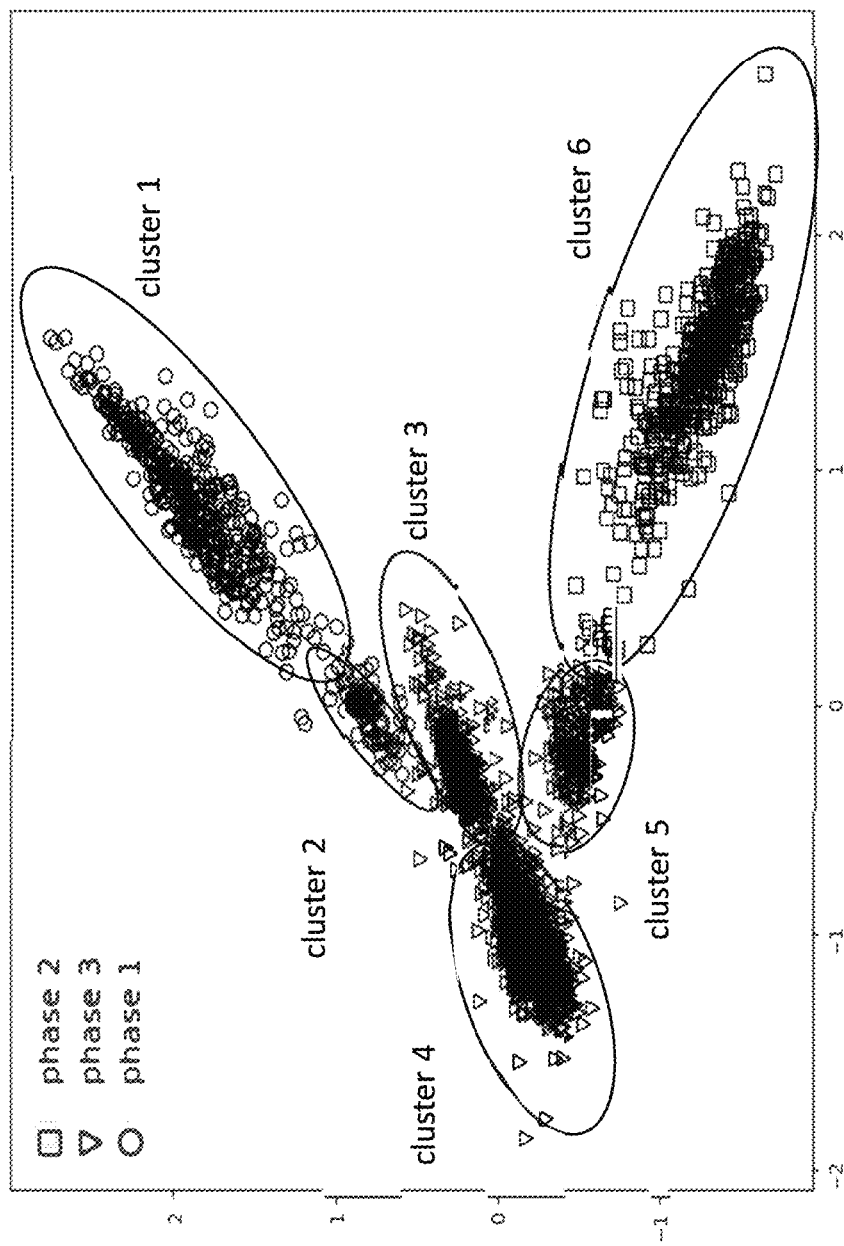
FIG. 14 shows an embedded space after input data processing and a phase determination method according to an embodiment of the disclosure.

FIG. 14 shows an embedded space after input data processing and a phase determination method, according to an embodiment of the disclosure, of a IEEE 8500-bus system. As depicted in FIG. 14, six clusters could be identified. The phase connections are indicated by "square", "triangle", and "circle" markers.

Figure 15:
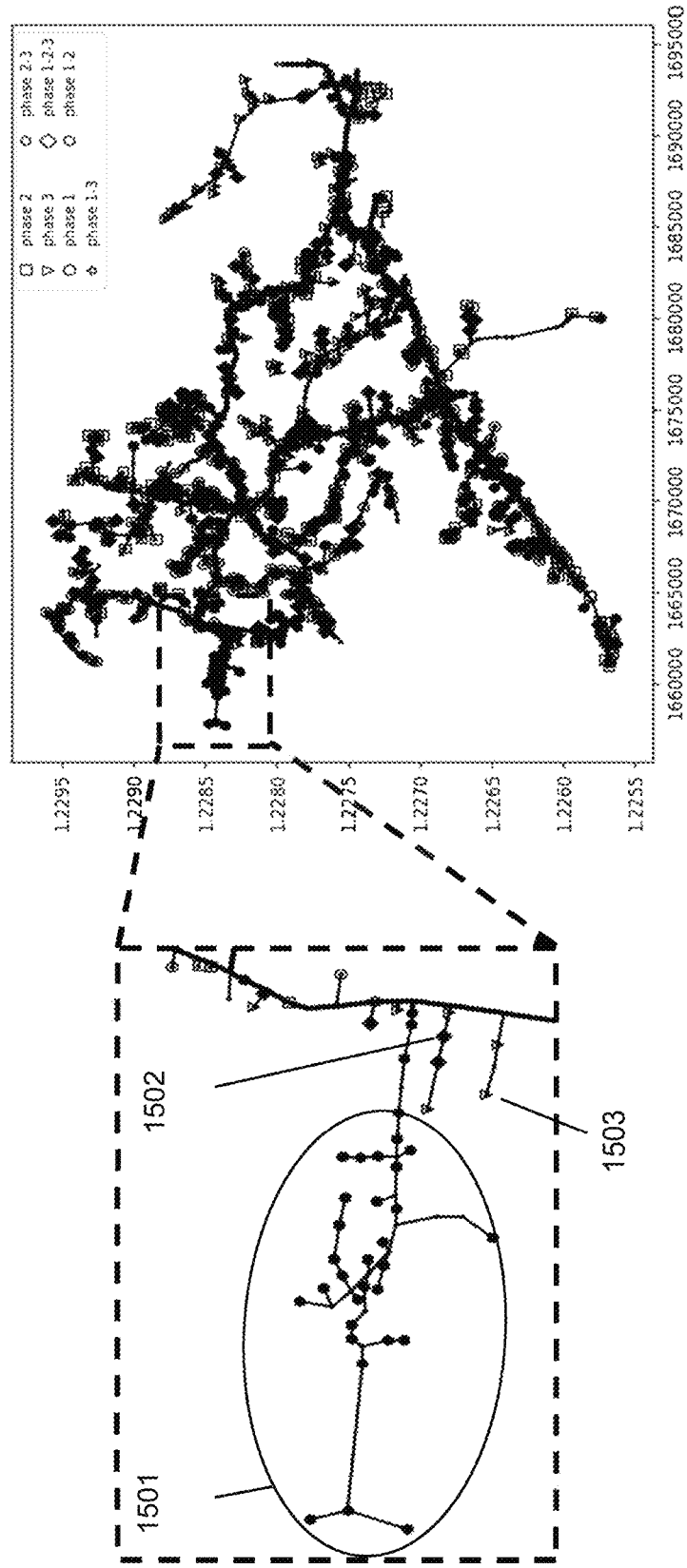
FIG. 15 shows a part of a bus system with corresponding reference phase connections according to an embodiment of the disclosure.

FIG. 15 shows a part of a IEEE8500 bus system with corresponding reference phase connections according to an embodiment of the disclosure. The filled markers denote errors in phase connections, both within laterals and laterals as a whole, which in practice would not be known. In the zoomed section on the left an error of reference phase connections for the whole lateral 1501 and for a single grid component 1502 are shown. Furthermore, a correct phase label for a single grid component 1503 is shown.

Figure 16:
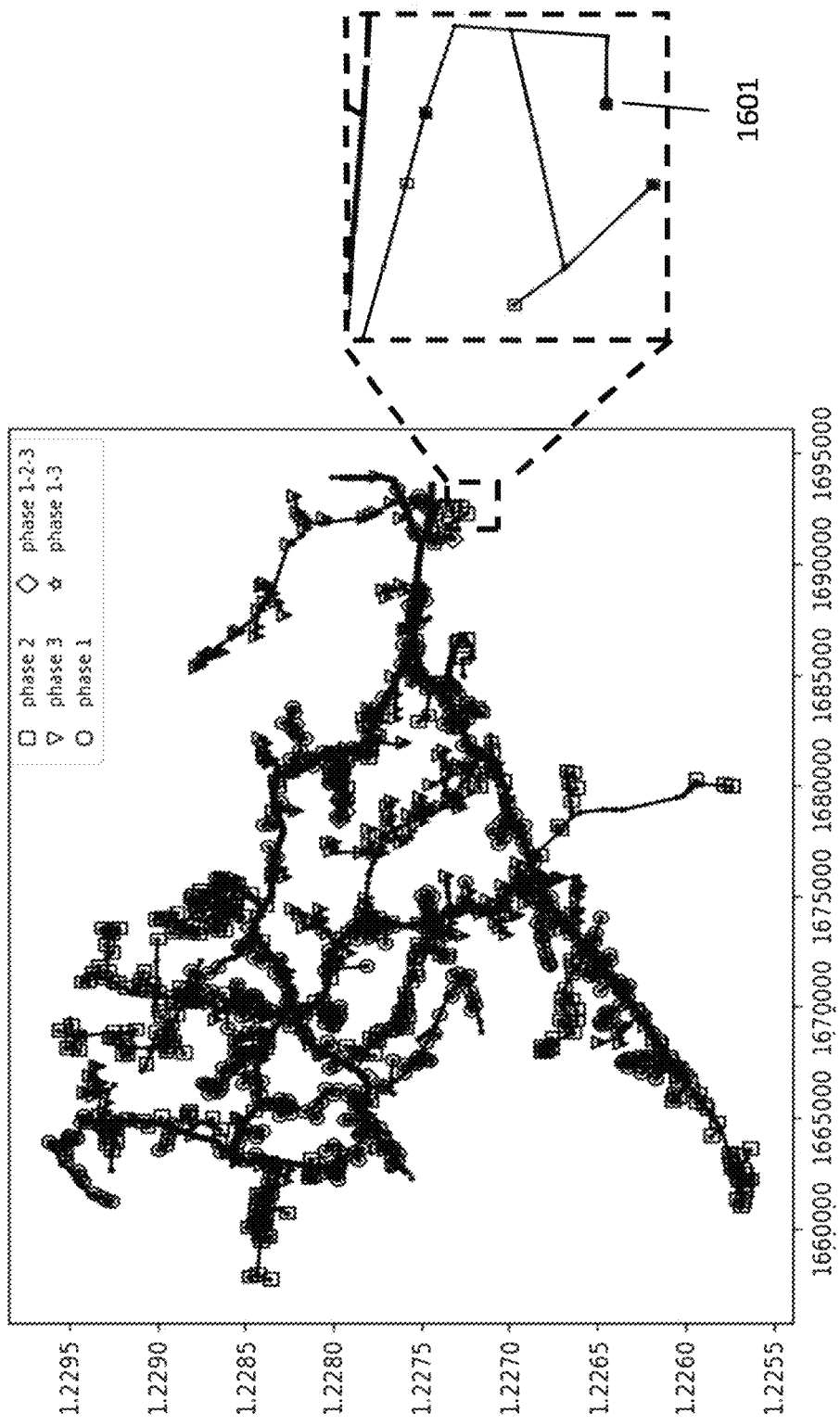
FIG. 16 shows a part of a bus system with determined phase connections according to an embodiment of the disclosure.

FIG. 16 shows a part of the IEEE8500 bus system with determined phase connections for load smart meters according to an embodiment of the disclosure. Filled markers denote not recognized errors in determined phase connections, i.e. difference between the determined phase connections and the ground truth. On the zoomed section on the right a not corrected phase connection 1601 is shown.

Figure 17:
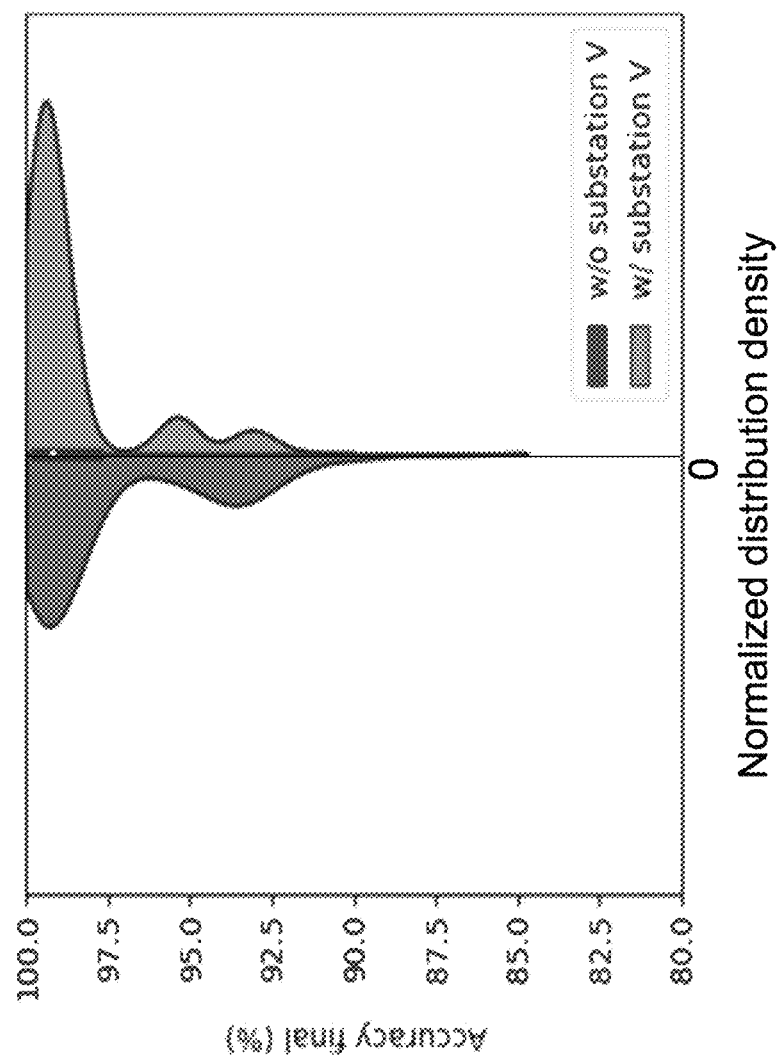
FIGS. 17a and 17b show the accuracy distributions for 520 random initializations of a bus system according to an embodiment of the disclosure.
Figure 17:
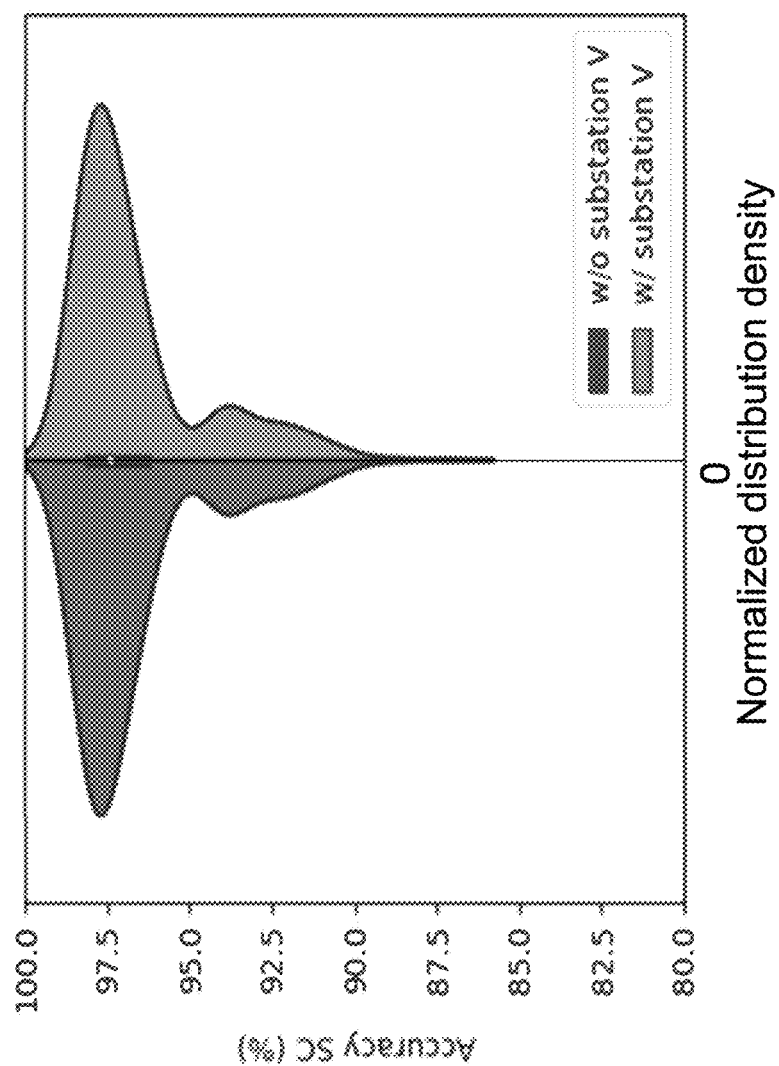
Figure 18:
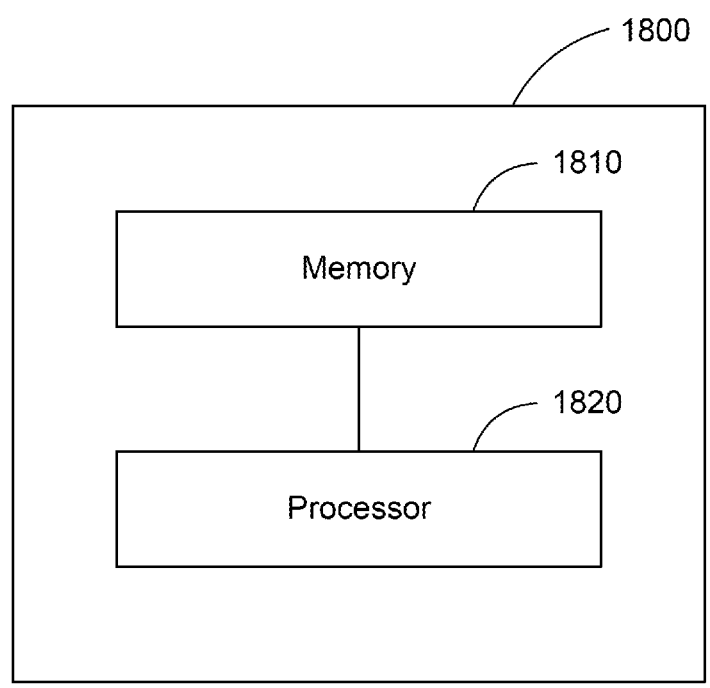
FIG. 18 shows a computer according to an embodiment of the disclosure.

FIGS. 17a and 17b shows accuracy distributions for 520 random initializations of a IEEE 8500-bus system including random combinations of measurement errors and random clustering initializations. FIG. 17a shows the accuracy after spectral clustering with and without additional substation measurements, and FIG. 17b shows final accuracy after subsequent multi-tree clustering with and without additional substation measurements.

While various embodiments of the present disclosure have been described above, it should be understood that they have been presented by way of example only, and not by way of limitation. Likewise, the various diagrams may depict an example architectural or configuration, which are provided to enable persons of ordinary skill in the art to understand exemplary features and functions of the present disclosure. Such persons would understand, however, that the present disclosure is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations can be used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A skilled person would further appreciate that any of the various illustrative logical blocks, units, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software unit"), or any combination of these techniques.

To clearly illustrate this interchangeability of hardware, firmware and software, various illustrative components, blocks, units, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure. In accordance with various embodiments, a processor, device, component, circuit, structure, machine, unit, etc. can be configured to perform one or more of the functions described herein. The term "configured to" or "configured for" as used herein with respect to a specified operation or function refers to a processor, device, component, circuit, structure, machine, unit, etc. that is physically constructed, programmed and/or arranged to perform the specified operation or function.

Furthermore, a skilled person would understand that various illustrative methods, logical blocks, units, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, units, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein. If implemented in software, the functions can be stored as one or more instructions or code on a computer-readable medium. Thus, the steps of a method or algorithm disclosed herein can be implemented as software stored on a computer-readable medium.

Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

Additionally, memory or other storage, as well as communication components, may be employed in embodiments of the present disclosure. It will be appreciated that, for clarity purposes, the above description has described embodiments of the present disclosure with reference to different functional units and processors. However, it will be apparent that any suitable distribution of functionality between different functional units, processing logic elements or domains may be used without detracting from the present disclosure. For example, functionality illustrated to be performed by separate processing logic elements, or controllers, may be performed by the same processing logic element, or controller. Hence, references to specific functional units are only references to a suitable means for providing the described functionality, rather than indicative of a strict logical or physical structure or organization.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

What is claimed is:

1. A method for determining phase connections of grid components in a power grid, the method comprising:
calculating a relative similarity between pairs of at least one part of time series of measured voltage data of the grid components;
grouping the grid components into a plurality of clusters based on the relative similarities;
for each of the plurality of clusters, determining a phase connection of that cluster;
for each of the grid components, determining a phase connection of that grid component based on the phase connection that was determined for the cluster into which that grid component was grouped; and
based on the determined phase connections of the grid components, performing an action comprising at least one of
balancing electrical power between phases of at least one part of the grid components,
detecting a failure of at least one grid component of the grid components,
determining a failure of a previously determined phase connection of at least one grid component of the grid components, or
determining a configuration of the power grid,
wherein the at least one part of the time series is divided into a plurality of time segments, each time segment comprising at least hundreds of instances of measured voltage data of each of the grid components, and wherein the calculating and the grouping are performed for each time segment.

2. The method according to claim 1, wherein, for at least one cluster of the plurality of clusters, determining the phase connection of the at least one cluster comprises:
determining a reference phase connection that is associated with a majority of the grid components in the at least one cluster; and
determining the phase connection of the at least one cluster as the determined reference phase connection.

3. The method according to claim 1, wherein, for at least one cluster of the plurality of clusters, determining the phase connection of that cluster comprises:
determining that at least one of the grid components in the at least one cluster has a known phase connection; and
when the similarity value between the at least one part of the time series of measured voltage of the at least one grid component and the at least one part of the time series of measured voltage of others of the grid components in the at least one cluster is above a predefined threshold, determining the phase connection of the at least one cluster as the determined reference phase connection.

4. The method according to claim 3, further comprising:
calculating the similarity value between the at least one part of the time series of measured voltage data of at least one grid component in at least one cluster of the plurality of clusters and the at least one part of the time series of measured voltage data of at least one grid component in another cluster of the plurality of clusters;
categorizing the at least one grid component from the at least one cluster into the other cluster of the plurality of clusters if the similarity value is above a predefined threshold; and
reassessing the phase connection of the grid components in the at least one cluster and the other cluster.

5. The method according to claim 4, comprising, for each of the grid components in each of the at least one cluster and the other cluster, determining the phase connection of that grid component based on the phase connection that was determined for that cluster into which that grid component was grouped.

6. The method according to claim 4, wherein the calculating and the categorizing is repeated until a number of grid components having a similarity value above the predefined threshold is above a predefined number.

7. The method according to claim 1, further comprising, before calculating the relative similarity between pairs of at least one part of time series of measured voltage data of the grid components, reducing the at least one part of the time series of measured voltage data by at least one dimension, using non-linear dimensionality reduction.

8. The method according to claim 1, further comprising automatically determining at least one parameter of the clustering, in particular wherein the at least one parameter is a number of clusters and/or a parameter for a similarity metric of the clustering.

9. The method according to claim 8, wherein the automatically determining at least one parameter is performed using a cluster validity index.

10. The method according to claim 9, wherein the cluster validity index is a Calinski-Harabasz index, a Silhouette index, or a Davies-Bouldin index.

11. The method according to claim 9, wherein the automatically determining at least one parameter is performed by maximizing and/or minimizing the cluster validity index.

12. The method according to claim 11, wherein the cluster validity index is a Calinski-Harabasz index, a Silhouette index, or a Davies-Bouldin index.

13. The method according to claim 1, wherein the time segments are overlapping or nonoverlapping.

14. The method according to claim 1, wherein, for at least one of the grid components, determining the phase connection of at least one grid component comprises, over at least a subset of the plurality of time segments, determining the phase connection, which was determined for the cluster into which the at least one grid component was grouped, over a majority of the at least a subset of the plurality of time segments, as the phase connection of the at least one grid component.

15. A device for determining phase connections of grid components in a power grid, the device comprising a non-transitory memory for storing computer instructions and a processor in communication with the memory, wherein, when the processor executes the computer instructions, the processor is configured to:
calculate a relative similarity between pairs of time series of measured voltage data of the grid components;
group the grid components into a plurality of clusters based on the relative similarities;
for each of the plurality of clusters, determine a phase connection of that cluster;
for each of the grid components, determine a phase connection of that grid component based on the phase connection that was determined for the cluster into which that grid component was grouped; and
based on the determined phase connections of the grid components, perform an action comprising at least one of
balancing electrical power between phases of at least one part of the grid components,
detecting a failure of at least one grid component of the grid components,
determining a failure of a previously determined phase connection of at least one grid component of the grid components, or
determining a configuration of the power grid,
wherein the time series is divided into a plurality of time segments, each time segment comprising at least hundreds of instances of measured voltage data of each of the grid components, and wherein the calculating and the grouping are performed for each time segment.

16. A non-transitory computer-readable medium having instructions stored thereon, wherein the instructions, when executed by a computer, cause the computer to:
calculate a relative similarity between pairs of time series of measured voltage data of grid components in a power grid;
group the grid components into a plurality of clusters based on the relative similarities;
for each of the plurality of clusters, determine a phase connection of that cluster;
for each of the grid components, determine a phase connection of that grid component based on the phase connection that was determined for the cluster into which that grid component was grouped; and
based on the determined phase connections of the grid components, perform an action comprising at least one of
balancing electrical power between phases of at least one part of the grid components,
detecting a failure of at least one grid component of the grid components,
determining a failure of a previously determined phase connection of at least one grid component of the grid components, or
determining a configuration of the power grid,
wherein the time series is divided into a plurality of time segments, each time segment comprising at least hundreds of instances of measured voltage data of each of the grid components, and wherein the calculating and the grouping are performed for each time segment.

* * * * *